(12) United States Patent
Tsubaki et al.

(10) Patent No.: US 9,566,802 B2
(45) Date of Patent: Feb. 14, 2017

(54) TREATED OBJECT MODIFYING APPARATUS, PRINTING APPARATUS, PRINTING SYSTEM, AND METHOD FOR MANUFACTURING PRINTOUT

(71) Applicant: Ricoh Company, Ltd., Tokyo (JP)

(72) Inventors: Kengo Tsubaki, Kanagawa (JP); Satoshi Katoh, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 32 days.

(21) Appl. No.: 14/656,552

(22) Filed: Mar. 12, 2015

(65) Prior Publication Data
US 2015/0258815 A1    Sep. 17, 2015

(30) Foreign Application Priority Data

Mar. 17, 2014    (JP) ................................. 2014-054230
Feb. 4, 2015     (JP) ................................. 2015-020534

(51) Int. Cl.
*B41J 2/17*     (2006.01)
*B41J 11/00*    (2006.01)
(Continued)

(52) U.S. Cl.
CPC ............... *B41J 11/0015* (2013.01); *B41J 3/60* (2013.01); *B41M 1/36* (2013.01);
(Continued)

(58) Field of Classification Search
CPC ..... B41J 11/0015; B41J 15/005; B41J 11/002; B41J 13/0009; B41J 15/00
See application file for complete search history.

(56) References Cited

U.S. PATENT DOCUMENTS 6,528,129 B1    3/2003    Kondo
9,259,941 B2 *  2/2016    Watanabe ................ B41J 11/36
(Continued)

FOREIGN PATENT DOCUMENTS

JP    10-310652    11/1998
JP    2003-154256  5/2003
(Continued)

OTHER PUBLICATIONS

European Search Report, Application No. 15158939.7-170, dated Jul. 31, 2015, European Patent Office, 80298 Munich, Germany, EPO Form 1507N 06.12, and 1703 01.91 TRI.

*Primary Examiner* — Lamson Nguyen
(74) *Attorney, Agent, or Firm* — Duft Bornsen & Fettig LLP

(57) ABSTRACT

A treated object modifying apparatus includes a plasma-treating unit that includes a first electrode unit, a second electrode unit, and a dielectric that is interposed between the first electrode unit and the second electrode unit, and that plasma-treats a treated object positioned between the first electrode unit and the dielectric; and a controlling unit that controls the plasma-treating unit so that the amount of plasma energy delivered to any one of sides of the treated object in a duplex treatment that are performed with the one side of the treated object facing the first electrode unit and with the other side of the treated object facing the first electrode unit is different from the amount of plasma energy delivered to any one of the sides of the treated object in a simplex treatment that is performed with the one side of the treated object facing the first electrode unit.

18 Claims, 17 Drawing Sheets

(51) Int. Cl.
*H05H 1/24* (2006.01)
*B41M 1/36* (2006.01)
*H01J 37/32* (2006.01)
*B41J 3/60* (2006.01)

(52) U.S. Cl.
CPC .. *H01J 37/32532* (2013.01); *H01J 37/32889* (2013.01); *H05H 1/2406* (2013.01); *H01J 2237/338* (2013.01); *H05H 2001/2412* (2013.01)

(56) References Cited

U.S. PATENT DOCUMENTS

| | | |
|---|---|---|
| 9,387,696 B2 * | 7/2016 | Hiratsuka ............ B41J 11/0015 |
| 9,427,976 B2 * | 8/2016 | Nakai .................. B41M 5/0011 |
| 2007/0058019 A1 | 3/2007 | Saitoh et al. |
| 2009/0290007 A1 | 11/2009 | Saitoh et al. |
| 2011/0064489 A1 | 3/2011 | Bisaiji et al. |
| 2014/0078212 A1 | 3/2014 | Nakai et al. |
| 2014/0160197 A1 | 6/2014 | Hirose et al. |
| 2015/0035918 A1 | 2/2015 | Matsumoto et al. |

FOREIGN PATENT DOCUMENTS

| | | |
|---|---|---|
| JP | 2005-281796 | 10/2005 |
| JP | 2012-123323 | 6/2012 |
| JP | 2013-095562 | 5/2013 |
| JP | 2013-193291 | 9/2013 |

* cited by examiner

SMALLER ←——————→ LARGER
DOSE OF PLASMA ENERGY

| | PLASMA ENERGY LEVEL [kJ/m²] | | | | |
|---|---|---|---|---|---|
| | 0 | 1.4 | 7.0 | 14.0 | 27.9 |
| CONTACT ANGLE AFTER SIMPLEX TREATMENT (°) | 84.8 | 36.1 | 27.3 | 21.8 | 21.6 |
| CONTACT ANGLE AFTER DUPLEX TREATMENT (°) | 78.2 | 36.3 | 23.4 | 19.7 | 17.2 |

TREATED OBJECT MODIFYING APPARATUS, PRINTING APPARATUS, PRINTING SYSTEM, AND METHOD FOR MANUFACTURING PRINTOUT

CROSS-REFERENCE TO RELATED APPLICATIONS

The present application claims priority to and incorporates by reference the entire contents of Japanese Patent Application No. 2014-054230 filed in Japan on Mar. 17, 2014 and Japanese Patent Application No. 2015-020534 filed in Japan on Feb. 4, 2015.

BACKGROUND OF THE INVENTION

1. Field of the Invention

The present invention relates to a treated object modifying apparatus, a printing apparatus, a printing system, and a method for manufacturing a printout.

2. Description of the Related Art

Improvement in the throughput of conventional inkjet recording apparatuses by using high-speed printing has been difficult, because most inkjet recording apparatuses are shuttle-based, in which a head is moved back and forth in the width direction of a recording medium, e.g., a paper sheet or a film. To allow such recording apparatuses to provide high-speed printing, one-pass printing, in which an arrangement of a plurality of heads covering the entire width of the recording medium is passed across the sheet to record at once, has been disclosed recently.

One-pass printing is effective in improving the printing speed. However, because time intervals at which ink droplets are ejected to form dots adjacent to each other are short, and each of the ink droplets is ejected to form an adjacent dot before the ink droplet ejected earlier permeates into the recording medium, coalescence of the adjacent dots (hereinafter, referred to as ink-droplet interference) is likely to occur, and may reduce image quality. Related art examples are disclosed in Japanese Laid-open Patent Publication No. 10-310652, Japanese Laid-open Patent Publication No. 2003-154256, and Japanese Laid-open Patent Publication No. 2005-281796.

In view of the above-described conventional problems, there is a need to provide a treated object modifying apparatus, a printing apparatus, printing system, and a method for manufacturing a printout capable of modifying a treated object in such a manner that a high-quality printout is produced.

SUMMARY OF THE INVENTION

It is an object of the present invention to at least partially solve the problems in the conventional technology.

According to the present invention, there is provided a treated object modifying apparatus comprising: a plasma-treating unit that comprises a first electrode unit, a second electrode unit, and a dielectric that is interposed between the first electrode unit and the second electrode unit, and that plasma-treats a treated object positioned between the first electrode unit and the dielectric by applying a voltage to one of the first electrode unit and the second electrode unit; and a controlling unit that controls the plasma-treating unit so that an amount of plasma energy delivered to any one of sides of the treated object in a duplex treatment is different from an amount of plasma energy delivered to any one of the sides of the treated object in a simplex treatment, wherein the duplex treatment is a plasma treatment performed with one side of the treated object facing the first electrode unit, and another plasma treatment performed with the other side of the treated object facing the first electrode unit, and the simplex treatment is a plasma treatment performed with one side of the treated object facing the first electrode unit.

The present invention also provides a treated object modifying apparatus comprising: a first plasma-treating unit that comprises a first electrode unit, a second electrode unit, and a dielectric that is interposed between the first electrode unit and the second electrode unit, and that plasma-treats a treated object positioned between the first electrode unit and the dielectric by applying a voltage to one of the first electrode unit and the second electrode unit; a second plasma-treating unit that comprises a third electrode unit, a fourth electrode unit, and a dielectric that is interposed between the third electrode unit and the fourth electrode unit, and that plasma-treats the treated object positioned between the third electrode unit and the dielectric by applying a voltage to one of the third electrode unit and the fourth electrode unit; and a controlling unit that controls the plasma-treating units so that an amount of plasma energy delivered to any one of sides of the treated object in a duplex treatment is different from an amount of plasma energy delivered to any one of the sides of the treated object in a simplex treatment, wherein the duplex treatment is a plasma treatment performed with one side of the treated object facing the first electrode unit, and another plasma treatment performed with the other side of the treated object facing the third electrode unit, and the simplex treatment is a plasma treatment performed with one side of the treated object facing the first or the third electrode unit.

The present invention also provides a printing apparatus comprising: the treated object modifying apparatus described above firstly or secondly; and an inkjet recording unit that forms an image by ejecting ink to the treated object, wherein the inkjet recording unit forms an image by ejecting ink to the treated object applied with the plasma treatment.

The present invention also provides a printing system comprising: the treated object modifying apparatus described above firstly or secondly; and an inkjet recording apparatus that forms an image by ejecting ink to the treated object, wherein the inkjet recording apparatus forms an image by ejecting ink to the treated object applied with the plasma treatment.

The present invention also provides a method for manufacturing a printout that is a treated object printed with an image using inkjet recording, the method comprising: plasma-treating a treated object positioned between a first electrode unit and a dielectric that are included in a plasma-treating unit by applying a voltage to one of the first electrode unit and a second electrode unit, by using the first electrode unit, the second electrode unit, and the dielectric interposed between the first electrode unit and the second electrode; and forming an image by ejecting ink to the treated object applied with the plasma treatment, wherein an amount of plasma energy delivered to any one of sides of the treated object in a duplex treatment is different from an amount of plasma energy delivered to any one of the sides of the treated object in a simplex treatment, wherein the duplex treatment is a plasma treatment performed with one side of the treated object facing the first electrode unit, and another plasma treatment performed with the other side of the treated object facing the first electrode unit, and the simplex treatment is a plasma treatment performed with one side of the treated object facing the first electrode unit.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
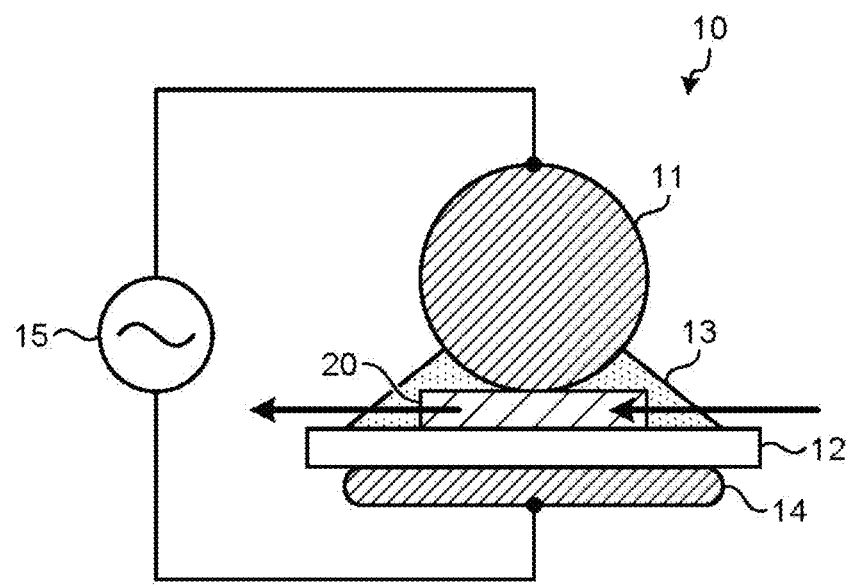
FIG. 1 is a schematic illustrating an example of a plasma treatment apparatus that performs a plasma treatment used in a first embodiment of the present invention.

Some preferred embodiments of the present invention will now be explained in detail with reference to the appended drawings. In the embodiments described hereunder, various limitations that are technically preferable are imposed because described hereunder are preferred embodiments of the present invention. The scope of the present invention is, however, not baselessly limited by the explanation hereunder, and not all of the configurations explained in the embodiments are not mandatory requirements of the present invention.

First Embodiment

A treated object modifying apparatus, a printing apparatus, a printing system, and a method for manufacturing a printout according to a first embodiment of the present invention will now be explained in detail with reference to some of the drawings. To enable a high-quality printout to be manufactured through modification of a surface of a treated object, the first embodiment has characteristics as described below.

In other words, in the first embodiment, a surface of a treated object (also referred to as a recording medium or a printing medium) is acidified to prevent dispersion of ink pigments, and to promote agglomeration of the ink pigments immediately after the ink lands on the treated object. Atmospheric plasma treatment using a dielectric-barrier, surface creeping streamer discharge is used as an example of the means for acidifying the surface of the treated object, but the embodiment is not necessarily limited thereto.

In the embodiment described below, by controlling the amount of plasma energy in such a manner that the acidity (pH) of the surface of the treated object is brought to a target range, the circularity of ink dots (hereinafter, simply referred to as dots) are improved, the dot coalescence is prevented, and the dot sharpness and the dot color gamut are improved and broadened. In this manner, image defects such as beading and breading can be reduced, and printouts with high-quality images can be manufactured. Furthermore, reducing the thickness of the agglomeration of pigments on the printing medium and making the agglomeration more even can reduce the amount of ink droplet, the energy for drying the ink, and thus printing costs.

In addition, in the embodiment described below, to bring the acidity (pH) of the front and the rear sides of the treated object to the target range, the doses of plasma energy delivered to the front and the rear sides are adjusted. In this manner, equivalently high-quality images can be printed on the front side and the rear side of the treated object.

Before explaining the first embodiment, an example of the plasma treatment used in the first embodiment will now be explained in detail with reference to some of the drawings. In the plasma treatment used in the first embodiment, the treated object is irradiated with atmospheric plasma, thereby causing reactions of the polymer and producing a hydrophilic functional group on the surface of the treated object. More specifically, the electrons emitted from the discharge electrode are accelerated in an electric field, and excite and ionize atmospheric atoms and molecules. The ionized atoms and molecules also emit electrons, so that the number of high-energy electrons is increased. As a result, streamer discharge (plasma) occurs. These high-energy electrons resulting from the streamer discharge unbind the polymer on the surface of the treated object (e.g., coat paper) (the starch serving as a binder and hardening the coat layer of coat paper with calcium carbonate has a polymer structure), and re-bind with oxygen radicals O*, the hydroxyl radicals (*OH), and ozone $O_3$ in the gas phase. This entire process is called plasma treatment. With this treatment, a polarity functional group such as hydroxyl or carboxyl group is produced on the surface of the treated object. As a result, hydrophilic property and acidity are given to the surface of the treated object. An increase in the carboxyl group promotes acidification of the surface of the treated object (drops the pH).

Having hydrophilic property improved, the ink on adjacent dots spreads across the surface of the treated object and coalesces together. In order to prevent mixing of colors between the dots resulting from coalescence, it is necessary to cause the colorant (for example, pigments or dye) in the dots to agglomerate quickly, to dry the vehicle, or to allow the vehicle to permeate into the treated object before the vehicle spreads. Because the plasma treatment explained as an example above also serves as acidifying means (process) for acidifying the surface of the treated object, the agglomeration speed of colorant in the dots can be increased. From this regard as well, the plasma treatment is effective as a pre-process of the inkjet recording process.

In the first embodiment, an atmospheric-pressure non-equilibrium plasma treatment using dielectric barrier discharge may be used as the plasma treatment, for an example. Acidification treatment with atmospheric-pressure non-equilibrium plasma is a preferable alternative for the plasma treatment of the treated object such as a recording medium, because the electron temperature is extremely high, and the gas temperature is near the ordinary temperature.

An exemplary method for generating atmospheric-pressure non-equilibrium plasma in a wide area is atmospheric-pressure non-equilibrium plasma treatment using dielectric barrier discharge that is based on streamer breakdown. Dielectric barrier discharge based on the streamer breakdown can be achieved by, for example, applying a high alternating voltage between electrodes covered by a dielectric. Various methods other than the dielectric barrier discharge based on streamer breakdown may also be used as methods for generating the atmospheric-pressure non-equilibrium plasma. Examples of such methods include dielectric barrier discharge in which an insulator, such as a dielectric, is inserted between electrodes, corona discharge in which an extreme non-uniform electric field is formed around a thin metal wire or the like, pulse discharge in which a short-pulse voltage is applied, and a combination of two or more of the above.

FIG. 1 is a schematic illustrating an example of a plasma treatment apparatus that performs the plasma treatment used in the first embodiment. For the plasma treatment used in the first embodiment, a plasma treatment apparatus 10 including discharge electrode (first electrode/third electrode) 11, a counter electrode (also referred to as a ground electrode; second electrode/fourth electrode) 14, a dielectric 12, and a high-frequency high-voltage power source 15, as illustrated in FIG. 1, may be used. In the plasma treatment apparatus 10, the discharge electrode 11 and the counter electrode 14 may be electrodes having their metal part exposed, or may be electrodes covered by a dielectric or an insulator such as insulating rubber or ceramic. The dielectric 12 interposed between the discharge electrode 11 and the counter electrode 14 may be an insulator such as polyimide, silicone, or ceramic. When corona discharge is used for the plasma treatment, the dielectric 12 may be omitted. By contrast, there are also cases in which providing the dielectric 12 is preferable, e.g., when the dielectric barrier discharge is used. In such cases, the effect of the plasma treatment can be enhanced by positioning the dielectric 12 near or in contact with the counter electrode 14, rather than near or in contact with the discharge electrode 11, so that the area of creeping discharge is increased. The discharge electrode 11 and the counter electrode 14 (or an electrode on the side provided with the dielectric 12 or the dielectric 12) may be positioned in contact with or not in contact with the treated object 20 passed between the two electrodes.

The high-frequency high-voltage power source 15 applies a high-frequency and high-voltage pulse voltage between the discharge electrode 11 and the counter electrode 14. The pulse voltage may be a pulse voltage resulting from boosting the pulse from an AC power source with a transformer, for example. The pulse voltage is ten kilovolts (p-p) or so, for example. The frequency of the pulse voltage may be, for example, approximately 20 kilohertz. By supplying the high-frequency and high-voltage pulse voltage between the two electrodes, atmospheric-pressure non-equilibrium plasma 13 is generated between the discharge electrode 11 and the dielectric 12. The plasma treatment is applied to the treated object 20 while the treated object 20 is passed between the discharge electrode 11 and the dielectric 12 while the atmospheric-pressure non-equilibrium plasma 13 is being generated. The effect of the plasma treatment becomes more intense when there is more space available for the active species to be generated. Therefore, in the example illustrated in FIG. 1, the front side of the treated object 20 nearer to the discharge electrode 11 is mainly plasma-treated, and the rear side is plasma-treated by a smaller degree than the front side.

Used in the plasma treatment apparatus 10 illustrated as an example in FIG. 1 are a rotating discharge electrode 11 and a belt-conveyer type dielectric 12. The treated object 20, being nipped between and carried by the rotating discharge electrode 11 and the dielectric 12, is passed through the atmospheric-pressure non-equilibrium plasma 13. In this manner, the surface of the treated object 20 is brought into contact with the atmospheric-pressure non-equilibrium plasma 13, and uniformly applied with the plasma treatment. However, the plasma treatment apparatus used in the first embodiment is not limited to the structure illustrated in FIG. 1. Various modifications are possible, including a structure in which the discharge electrode 11 is positioned near the treated object 20, without being brought into contact with the treated object 20, or a structure in which the discharge electrode 11 is mounted on the carriage as the inkjet head.

Figure 2:
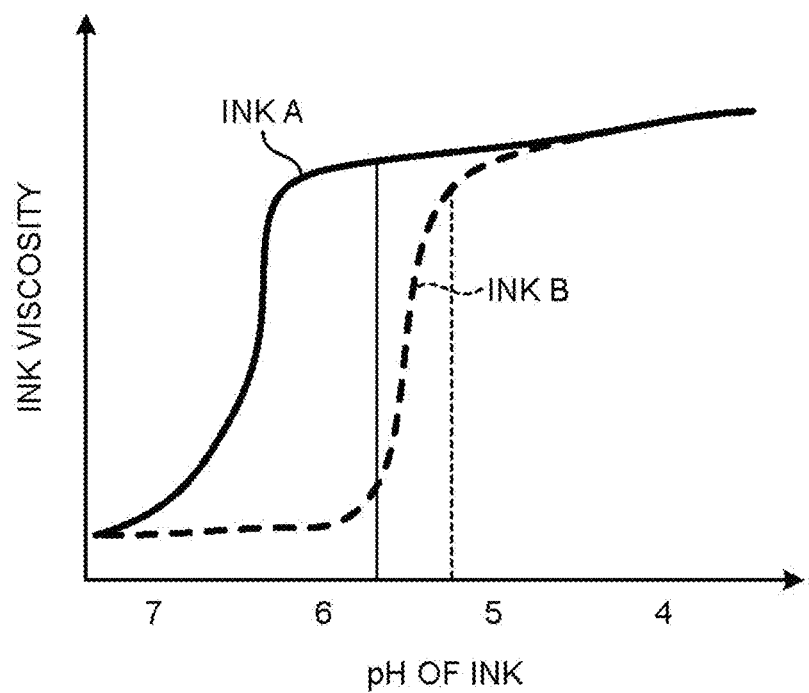
FIG. 2 is a schematic illustrating an example of a relation between the pH of ink and the ink viscosity in the first embodiment.

Acidification herein means bringing down the pH of the surface of a printing medium to a level in which pigments in ink agglomerate. Bringing down the pH means raising the hydrogen ion $H^+$ concentration of the object. Pigments in the ink before being brought into contact with the surface of the treated object are negatively charged, and the pigments are dispersed across the vehicle. FIG. 2 illustrates an example of a relation between the pH of ink and the ink viscosity. As illustrated in FIG. 2, ink is more viscous when the pH of the ink is lower. When the ink is more acidified, the negatively charged pigments in the vehicle of the ink become more electrically neutralized, and, as a result, the pigments agglomerate. For example, in the graph illustrated in FIG. 2, ink viscosity can be increased by reducing the pH of the surface of the printing medium to an ink pH that corresponds to the required viscosity. Such viscosity is achieved because, when the ink is attached to the acid surface of the printing medium, the pigments become electrically neutralized by the hydrogen ions $H^+$ on the surface of the printing medium, and agglomerate. In this manner, mixing of colors in adjacent dots can be prevented, and the pigments can be prevented from permeating deeper into the printing medium (and further into the rear side). To reduce the pH of the ink to a level corresponding to a required viscosity, however, it is necessary to reduce the pH of the surface of the printing medium to a level lower than that corresponding to the required viscosity.

The pH for achieving the required ink viscosity differs depending on the ink characteristics. In other words, there are some types of ink containing pigments that agglomerate and become more viscous at a pH that is relatively near neutral, as illustrated with ink A in FIG. 2, and there are other types of ink that require a lower pH for the pigments to agglomerate, compared with the ink A, as illustrated as ink B having different characteristics from the ink A.

The behavior of colorant agglomerating in a dot, the drying speed of the vehicle, and the permeation speed into the treated object differ depending on the size of an ink droplet that is dependent on the dot size (a small droplet, a medium droplet, or a large droplet), and the type of the treated object, for example. To address this issue, in the first embodiment, the amount of plasma energy in the plasma treatment may be controlled to a most appropriate level depending on the type of the treated object and the printing mode (droplet size).

Figure 3:
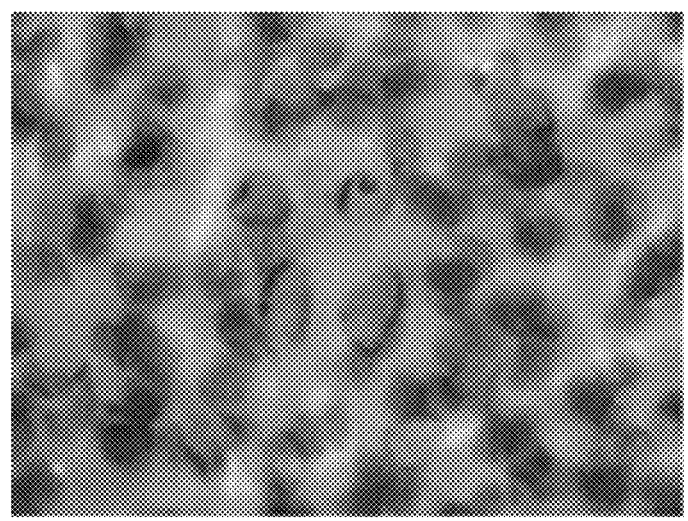
FIG. 3 is an enlargement of a photograph of an image formation surface achieved by performing an inkjet recording process to a treated object not applied with the plasma treatment according to the first embodiment.
Figure 4:
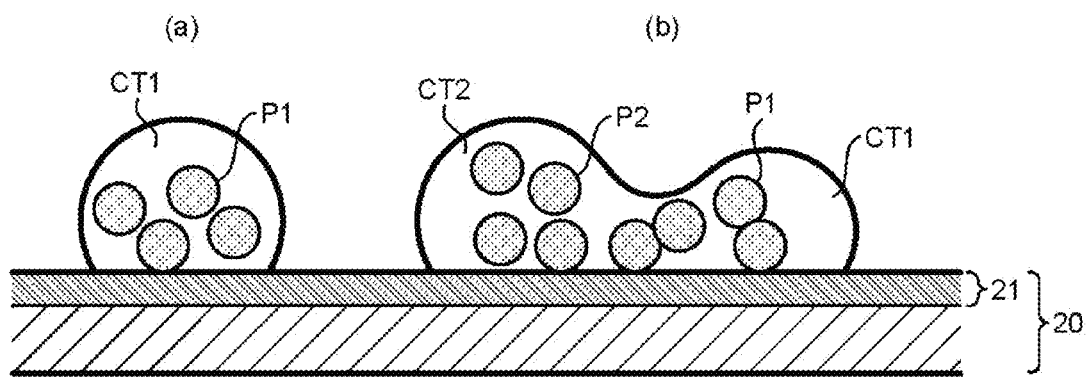
FIG. 4 is a schematic of exemplary dots formed on an image formation surface of the printout illustrated in FIG. 3.
Figure 5:
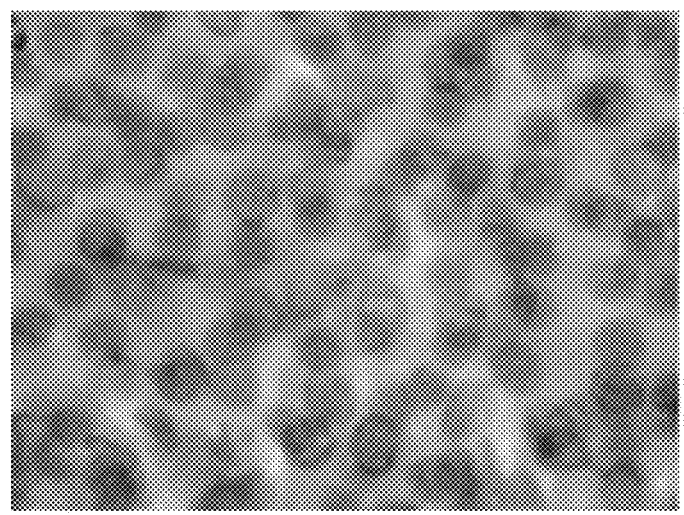
FIG. 5 is an enlargement of a photograph of an image formation surface achieved by performing the inkjet recording process to a treated object applied with the plasma treatment according to the first embodiment.
Figure 6:
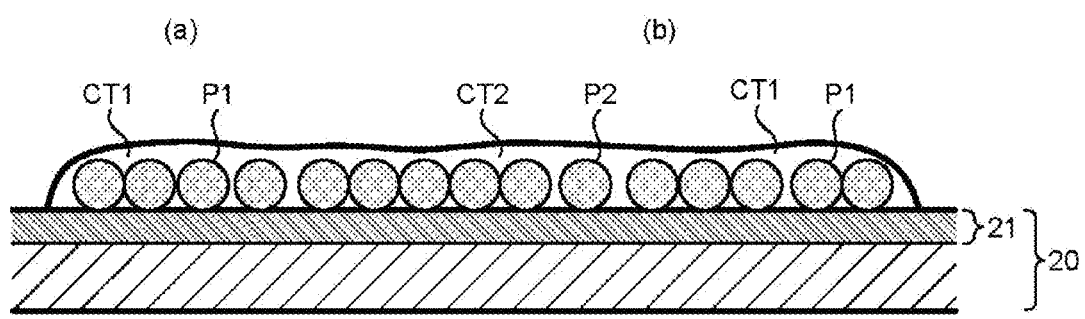
FIG. 6 is a schematic of exemplary dots formed on the image formation surface in the printout illustrated in FIG. 5.

Differences in printouts applied with and not applied with the plasma treatment according to the first embodiment will now be explained with reference to FIGS. 3 to 6. FIG. 3 is an enlargement of a photograph of an image formation surface achieved by performing the inkjet recording process to a treated object not applied with the plasma treatment according to the first embodiment. FIG. 4 is a schematic illustrating exemplary dots formed on an image formation surface of the printout illustrated in FIG. 3. FIG. 5 is an enlargement of a photograph of an image formation surface achieved by performing the inkjet recording process to a treated object applied with the plasma treatment according to the first embodiment. FIG. 6 is a schematic illustrating exemplary dots formed on the image formation surface in the printout illustrated in FIG. 5. To achieve the printout illustrated in FIGS. 3 and 5, a desk-top inkjet recording apparatus is used. As the treated object 20, general coat paper having a coat layer 21 (see FIG. 4) is used.

On the coat paper not applied with the plasma treatment, the coat layer 21 on the coat paper surface has bad wettability. Therefore, in the image formed by performing the inkjet recording process to the coat paper not having applied with the plasma treatment, the shape of the dots (vehicle CT1) attached on the surface of the coat paper become misshaped when the ink lands on the coat paper, for example, as illustrated in FIGS. 3 to 4. If a dot is formed adjacent to another dot that is not sufficiently dried, the vehicle CT1 and the vehicle CT2 coalesce together, as illustrated in FIGS. 3 to 4, when the ink for the adjacent dot lands on the coat paper.

This coalescence causes pigments P1 and P2 to move between the dots (mixing of colors), and the resultant image may have density unevenness resulting from beading, for example.

By contrast, the coat layer 21 on the coat paper surface of the coat paper applied with the plasma treatment according to the first embodiment has better wettability. In the image formed by applying the inkjet recording process to the coat paper applied with the plasma treatment, the vehicle CT1 spreads in a relatively flat true circle on the surface of the coat paper, as illustrated in FIG. 5, for example. This results in a flat dot, as illustrated in FIG. 6. Furthermore, because the polarity functional group produced by the plasma treatment makes the coat paper surface acid, the ink pigments become electrically neutralized, causing the pigments P1 to agglomerate, and the ink viscosity to be increased. Increased viscosity prohibits the movement of the pigments P1 and P2 between the dots (mixing of colors), even when the vehicle CT1 and the vehicle CT2 coalesce together, as illustrated in FIG. 6. Furthermore, because the polarity functional group is produced inside of the coat layer 21, the permeability of the vehicle CT1 is increased. Having permeability improved, the ink dries in a relatively short time. Because dots having wettability improved spreading in a true circle agglomerate while permeating, the pigments P1 agglomerate evenly in the height direction, and density unevenness resulting from beading or the like can be suppressed. FIGS. 4, 6 are schematic representations, and in reality, the pigments agglomerate in a layered manner also in the example illustrated in FIG. 6.

In the treated object 20 applied with the plasma treatment according to the first embodiment, the hydrophilic functional group is produced on the surface of the treated object 20 in the plasma treatment, and so the treated object 20 has better wettability. Furthermore, the plasma treatment makes the surface of the treated object 20 coarser, and as a result, the wettability of the surface of the treated object 20 is improved again. Moreover, because the plasma treatment produces the polarity functional group, the surface of the treated object 20 is acidified. This acidification allows the ink landed on the surface of the treated object 20 to spread evenly and the negatively charged pigments to become neutralized and agglomerate on the surface of the treated object 20, thereby making the ink more viscous. As a result, movements of the pigments can be prohibited even if the dots coalesce together. Furthermore, because the polarity functional group produced on the surface of the treated object 20 is also produced in the coat layer 21, the vehicle quickly permeates into the treated object 20. This quick permeation allows a drying time to be reduced. In other words, because the dots with better wettability spread in a true circle, and permeate into the treated object while the movements of pigments are prohibited by the agglomeration, the shape near the true circle can be maintained.

Figure 7:
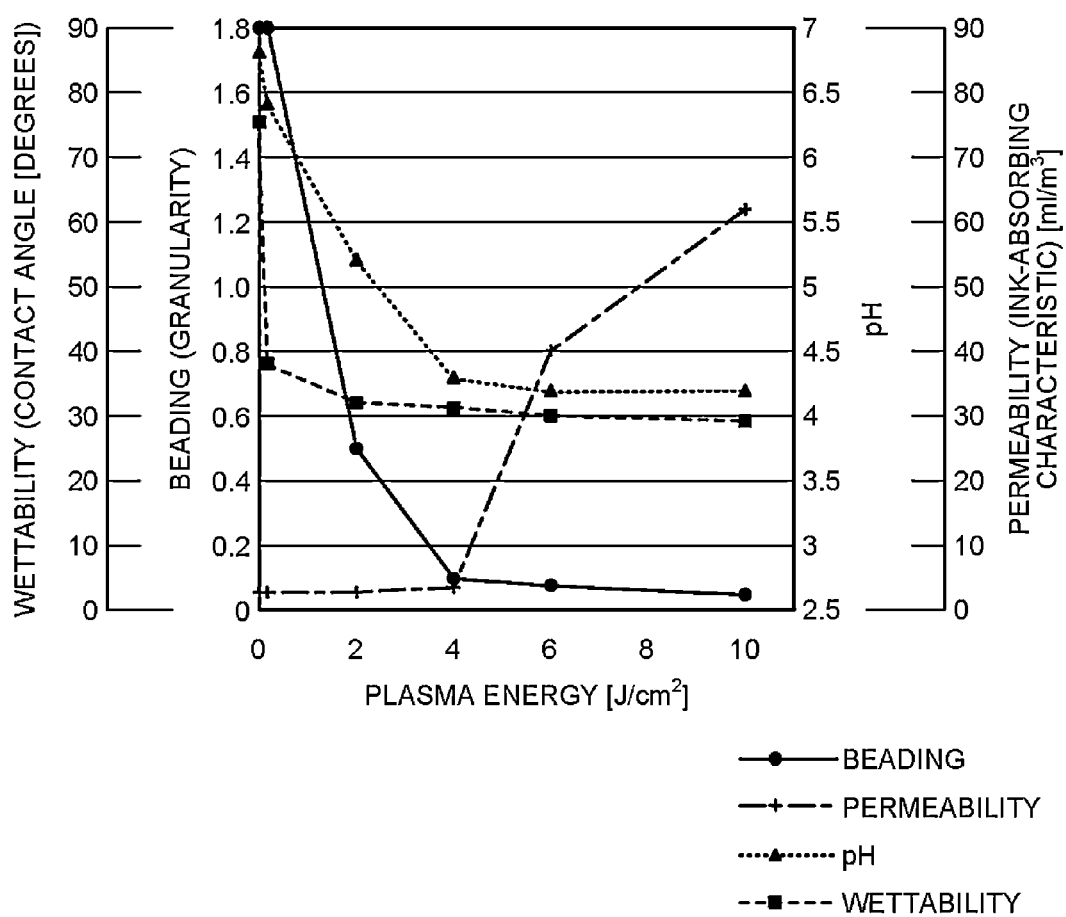
FIG. 7 is a graph illustrating a relation between the amount of plasma energy, the wettability, the beading, the pH, and the permeability of a surface of the treated object in the first embodiment.

FIG. 7 is a graph illustrating a relation among the amount of plasma energy, the wettability, the beading, the pH, and the permeability of the treated object surface in the first embodiment. FIG. 7 illustrates how the surface characteristics (wettability, beading, pH, permeability (ink-absorbing characteristic)) of coat paper on which printing is performed as a treated object 20 change depending on the amount of plasma energy. To conduct the evaluation resulting in the graph illustrated in FIG. 7, water-based pigment ink (alkaline ink in which negatively charged pigments are dispersed) containing pigments that agglomerate with acid is used.

As illustrated in FIG. 7, the wettability of a coat paper surface has sharply improved at small doses of low plasma energy (e.g., equal to or smaller than 0.2 J/cm$^2$ or so), and does not improve very much even if the energy increases any further. By contrast, the pH of the coat paper surface decreases to some extent as the amount of plasma energy increases, but saturates at a point where the amount of plasma energy exceeds a certain level (e.g., 4 J/cm$^2$ or so). The permeability (ink-absorbing characteristic) has sharply improved around the area near where the pH decrease saturated (e.g., 4 J/cm$^2$ or so). This phenomenon, however, differs depending on the polymer component of the ink.

As described above, in the relation between the surface characteristics of the treated object 20 and the image quality, the dot circularity improves when the wettability of the surface has improved. It is quite likely that this phenomenon occurs because the wettability of the surface of the treated object 20 has been improved and is uniformized due to the increased coarseness of the surface introduced by the plasma treatment and the hydrophilic polarity functional group generated by the plasma treatment. It is also quite likely that the plasma treatment removes water-repelling factors such as dusts, oil, and calcium carbonate from the surface of the treated object 20. In other words, it is quite probable that ink droplets are allowed to spread evenly toward the circumferential direction, and the dot circularity has been improved, due to the improved wettability of the surface of the treated object 20 and destabilizing factors removed from the surface of the treated object 20.

By acidifying (decreasing the pH of) the surface of the treated object 20, agglomeration of ink pigments, improvement in permeability, and permeation of the vehicle into the coat layer 21 are promoted. As a result, the pigment density on the surface of the treated object 20 is increased. An increased pigment density can prohibit movements and mixing of the pigments even when the dots coalesce, and the pigments are allowed to settle and agglomerate evenly on the surface of the treated object 20. The effect of prohibiting the mixture of pigments, however, varies depending on the constituent of the ink and the size of an ink droplet. For example, mixing of pigments due to dot coalescence occurs less frequently when the ink droplet is smaller in size compared with when it is larger in size. This is because the vehicle in a smaller droplet dries and permeates faster, and a small pH reaction can cause the pigments to agglomerate. The effect of the plasma treatment varies depending on the types of the treated object 20 and the environment (e.g., humidity) surrounding it. Therefore, the amount of plasma energy used in the plasma treatment may be controlled to a most appropriate level depending on the ink droplet size, the type of the treated object 20 and the environment surrounding the treated object 20. As a result, in some cases, the surface modification efficiency of the treated object 20 is improved, and further energy saving is achieved.

Figure 8:
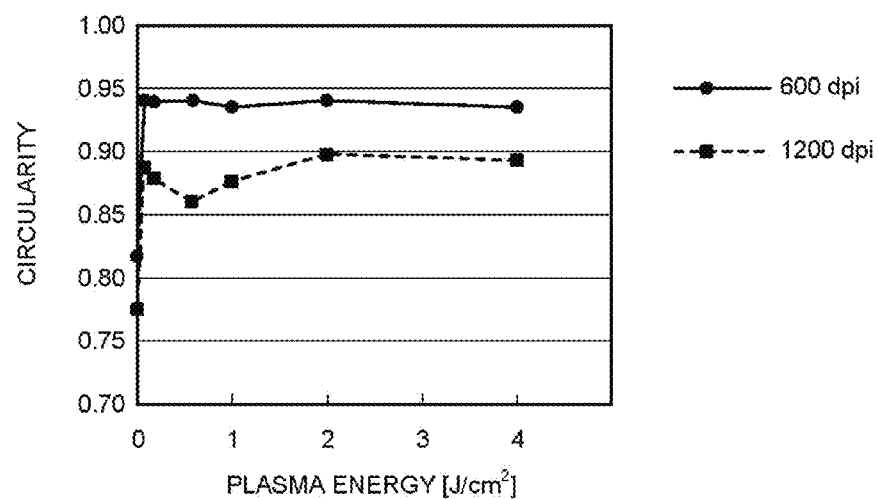
FIG. 8 is a graph illustrating a relation between the amount of plasma energy and the dot circularity according to the first embodiment.
Figure 9:
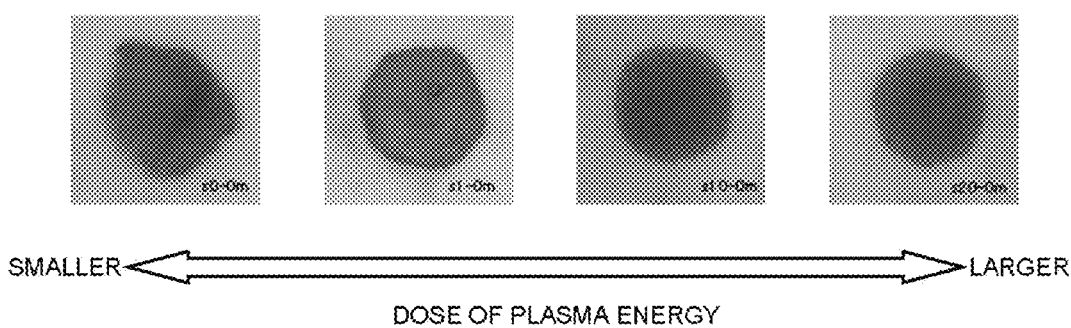
FIG. 9 is a schematic of a relation between the amount of plasma energy and the shape of actually formed dots in the first embodiment.

A relation between the amount of plasma energy and the dot circularity will now be explained. FIG. 8 is a graph illustrating a relation between the amount of plasma energy and the dot circularity. FIG. 9 is a schematic of a relation between the amount of plasma energy and the shape of actually formed dots. Illustrated in FIGS. 8 and 9 are examples in which the ink of the same type and the same color is used.

As illustrated in FIGS. 8 and 9, the dot circularity dramatically has been improved even with small doses of plasma energy (e.g., equal to or smaller than 0.2 J/cm$^2$ or so). It is quite likely that, this is because the plasma treatment of the treated object 20 has increased the dot (vehicle) viscosity and the permeability of the vehicle, the pigments have agglomerated evenly, as mentioned earlier.

Figure 10:
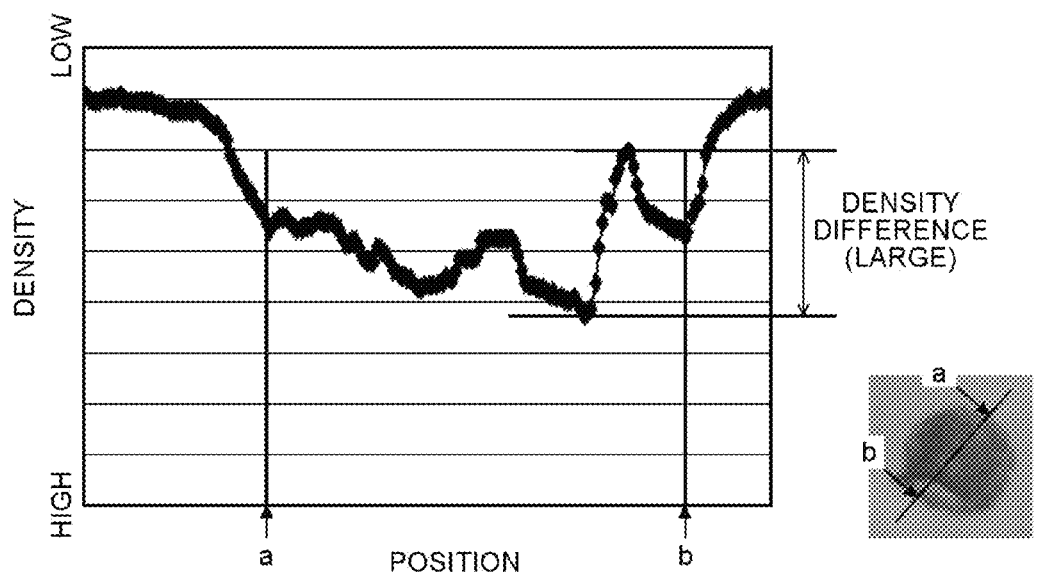
FIG. 10 is a graph illustrating a dot pigment density achieved without the plasma treatment according to the first embodiment.
Figure 11:
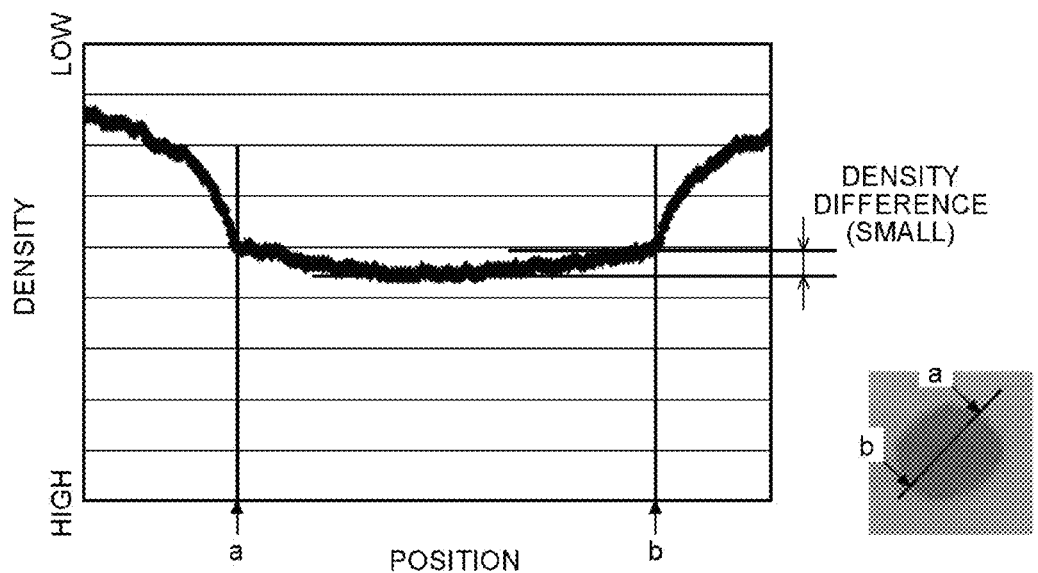
FIG. 11 is a graph illustrating the dot pigment density achieved with the plasma treatment according to the first embodiment.

The dot pigment densities when the plasma treatment is performed and when the plasma treatment is not performed will now be explained. FIG. 10 is a graph illustrating a dot pigment density achieved without the plasma treatment according to the first embodiment. FIG. 11 is a graph illustrating the dot pigment density achieved with the plasma treatment. Each of FIGS. 10 and 11 illustrates the density along the line segment a-b in the dot image illustrated at the lower right in the corresponding drawing.

In the measurement in FIGS. 10 and 11, images of the formed dots are collected, and the density unevenness in the image is measured. The variation in the densities is then calculated. As it may be clear from the comparison of FIGS. 10 and 11, the density variation (differences in the density) is smaller with the plasma treatment (FIG. 11), than that without the plasma treatment (FIG. 10). Taking this result into consideration, the amount of plasma energy used in the plasma treatment may be optimized so as to minimize the variation (difference in the density), based on the density variation calculated in the manner described above. In this manner, sharper images can be formed.

The density variation may also be calculated by measuring the thickness of the pigments using an optical interference film thickness measurement technique, without limitation to the calculation described above. In such a case, a most appropriate amount of plasma energy for minimizing the thickness of the pigments can be selected.

Illustrated in FIGS. 8 to 11 are exemplary results of measurements of dots in a first color formed on the surface of the treated object. The same measurement method used for the dots in the first color may also be used to achieve the results illustrated in FIGS. 8 to 11 for a second color.

A treated object modifying apparatus, a printing apparatus, a printing system, and a method for manufacturing a printout according to the first embodiment will now be explained in detail with reference to some of the drawings. Explained in the first embodiment is an image forming apparatus having four ejection heads (recording heads, ink heads) for four colors of black (K), cyan (C), magenta (M) and yellow (Y), but the ejection head is not limited thereto. In other words, the image forming apparatus may also have ejection heads corresponding to colors green (G), read (R), and the others, or may have an ejection head only for the black (K) color. In the explanation hereunder, K, C, M, and Y correspond to black, cyan, magenta, and yellow, respectively.

Furthermore, in the description of the first embodiment, continuous paper wound into a roll (hereinafter, referred to as roll paper) is used as an example of the treated object 20. The treated object 20 however is not limited thereto, and may be any recording medium on which an image can be formed, including cut paper, for example. If the recording medium is paper, any type of paper such as standard paper, high-quality paper, recycled paper, thin paper, thick paper, and coat paper may be used. Furthermore, the image forming apparatus may use anything with a surface on which an image can be formed with ink as the treated object, including an overhead projector (OHP) sheet, a synthetic resin film, and a metal thin film. The roll paper may be continuous paper with perforations at a given interval allowing the paper sheet to be torn apart (continuous stationary). In such a case, a page in the roll paper corresponds to an area extending between a pair of perforations at a given interval, for example.

Figure 12:
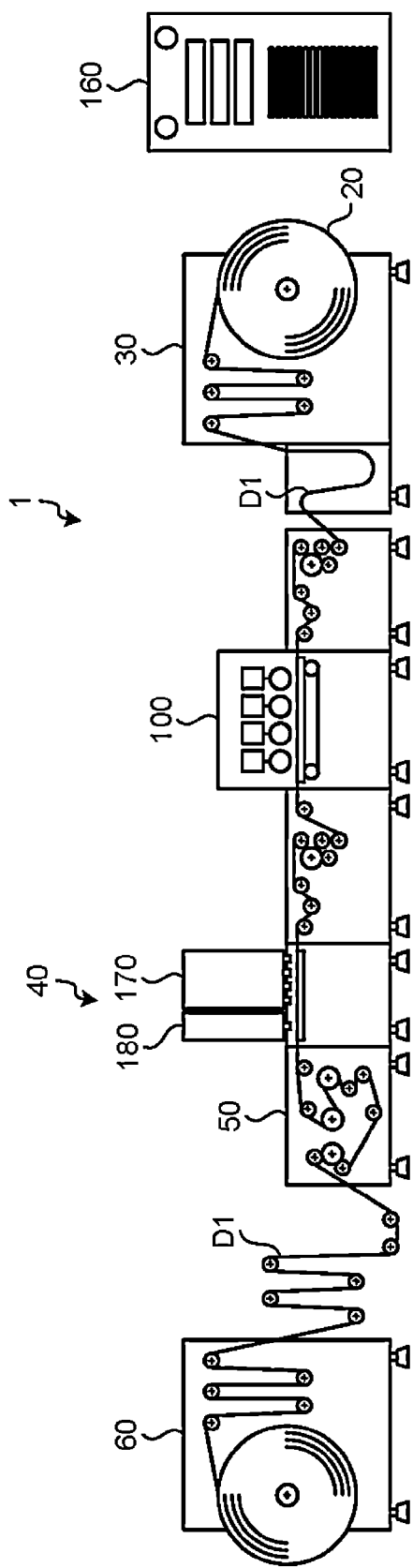
FIG. 12 is a schematic illustrating a general structure of a printing apparatus (system) according to the first embodiment.

FIG. 12 is a schematic illustrating a general structure of a printing apparatus (system) according to the first embodiment. As illustrated in FIG. 12, this printing apparatus (system) 1 includes a feeding unit 30 that feeds (conveys) the treated object 20 (roll paper) along a conveying path D1, a plasma treatment apparatus 100 that plasma-treats the fed treated object 20 as a pre-process, and an image forming apparatus 40 that forms an image on the surface of the plasma-treated object 20. The image forming apparatus 40 may include an inkjet head 170 that forms an image on the plasma-treated object 20 via an inkjet process, and a pattern reading unit 180 that reads a dot pattern in the formed image to check for the printing quality. The image forming apparatus 40 may also include a post-processing unit that applies a post-process to the treated object 20 having an image formed. The printing apparatus (system) 1 may also include a dryer unit 50 for drying the post-processed treated object 20, and an ejection unit 60 for ejecting the treated object 20 having an image formed (and having been post-processed, in some cases). The printing apparatus (system) 1 may also include a controlling unit 160 that generates raster data from the image data to be printed, and that controls each unit included in the printing apparatus (system) 1. This controlling unit 160 is capable of communicating with the printing apparatus (system) 1 over a wired or wireless network. The controlling unit 160 may not be provided as one computer, and may be a plurality of computers connected over a network such as a local area network (LAN). The controlling unit 160 may also include a plurality of controlling units provided for the respective units of the printing apparatus (system) 1.

The units (apparatuses) illustrated in FIG. 12 may be housed in respective separate housings to provide the printing system 1 as a whole, or may be housed in the same housing to provide the printing apparatus 1. When the units are provided as the printing system 1, the controlling unit 160 may be included in any one of the units or the apparatuses.

Figure 13:
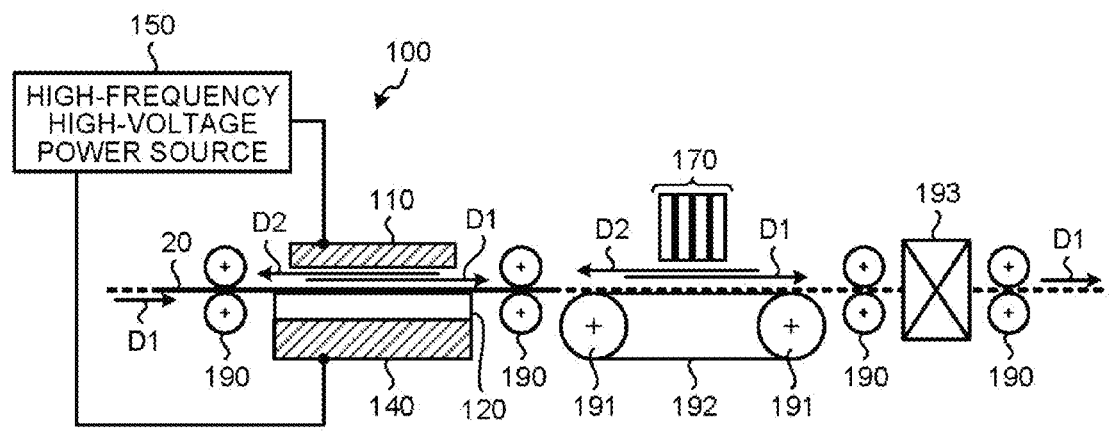
FIG. 13 is a schematic of exemplary general structures around the plasma treatment apparatus and the inkjet head according to the first embodiment executing simplex printing.

The printing apparatus (system) 1 according to the first embodiment will now be explained more in detail. FIG. 13 is a schematic of exemplary general structures around the plasma treatment apparatus and the inkjet head according to the first embodiment executing simplex printing. Because the other structures are the same as those in the printing apparatus 1 illustrated in FIG. 12, detailed explanations thereof are omitted herein. Described in FIG. 13 is an example in which cut paper is used as the treated object 20.

As illustrated in FIG. 13, the plasma treatment apparatus 100 includes a discharge electrode 110 (first electrode/third electrode) and a counter electrode 140 (second electrode/fourth electrode) having a part of the conveying path D1 interposed therebetween, a dielectric 120 positioned between the discharge electrode 110 and the counter electrode 140, and a high-frequency high-voltage power source 150 that supplies a high-frequency and high-voltage pulse voltage to the discharge electrode 110. There is a space between the dielectric 120 and the discharge electrode 110. Conveying rollers 190 and conveyors 191 and 192, which are provided as appropriate, positioned on the upstream side of this space in the conveying path D1 feed the treated object 20 to be treated into this space, and discharge the treated object 20 from this space. Illustrated in FIG. 13 is an example in which the dielectric 120 is positioned near or in contact with the counter electrode 140, but the dielectric 120 may be positioned near or in contact with the discharge electrode 110. In such a case, the treated object 20 is passed through the space between the dielectric 120 and the counter electrode 140. Furthermore illustrated in FIG. 13 is an example in which the dielectric barrier discharge is used as the plasma treatment, but corona discharge may be used to omit the dielectric 120. Furthermore, other apparatuses appropriately selected as required may be provided around the inkjet head 170. Examples of the other apparatuses include an ink supplying apparatus, a maintenance apparatus for the inkjet head 170, and a controller. All of the above apply in other exemplary configurations provided below.

The high-frequency high-voltage power source 150 generates atmospheric-pressure non-equilibrium plasma in the space between the discharge electrode 110 and the dielectric 120, by applying a discharging pulse voltage to the discharge electrode 110. The treated object 20 to be treated has its surface plasma-treated by being brought into contact with the atmospheric-pressure non-equilibrium plasma, as the treated object 20 is passed through the space between the discharge electrode 110 and the dielectric 120. At this time, the frequency and the voltage of the pulse voltage supplied from the high-frequency high-voltage power source 150 to the discharge electrode 110 (corresponding to the amount of plasma energy) may be adjusted to a level required to bring the pH of the surface of the treated object 20 to a given level or below.

Another alternative for achieving the amount of plasma energy required for acidifying the surface of the treated object 20 is extension of the time of the plasma treatment. This may be achieved by decreasing the speed at which the treated object 20 is conveyed, for example. When images are recorded on the treated object 20 at a high speed, however, a shorter plasma treatment time is preferable. A way to reduce the time of plasma treatment is to use a plurality of discharge electrodes and to drive a required number of the discharge electrodes based on the printing speed and the required pH. Another possible way is adjustment of the intensity of the plasma energy dose applied to each of the discharge electrodes. The acidification treatment may also be adjusted by providing a humidity adjusting mechanism to the plasma treatment apparatus 100 (Japanese Patent Application Laid-open No. 2013-199017). Any other modifications including any combinations of the above and use of any other methods are still possible, without the limitation to the above.

Furthermore, providing a plurality of discharge electrodes to the plasma treatment apparatus 100 is also effective from the view of uniformly acidifying the surface of the treated object 20. In other words, at the same conveying speed (or printing speed), for example, the time for which the treated object 20 is passed through the plasma-filled space can be extended by treating the treated object 20 with a plurality of discharge electrodes, rather than by treating with one discharge electrode. As a result, the acidification treatment can be provided to the surface of the treated object 20 more evenly.

Furthermore, illustrated in FIG. 13 is an example in which the discharge electrode 110 is kept away, by a few millimeters or so, from the treated object 20 being passed through between the discharge electrode 110 and the dielectric 120, but the present invention is not limited thereto. For example, the discharge electrode 110 may be a roller electrode with a circular cross section, and may be brought into contact and rotate with the treated object 20 as the treated object 20 is passed between the discharge electrode 110 and the dielectric 120. Furthermore, a thin electrode, such as a wire electrode or a blade electrode, may be used as the discharge electrode 110.

The inkjet head 170 is positioned on the downstream side of the plasma treatment apparatus 100. The inkjet head 170 may be provided with a plurality of heads of the same color (for example, four heads for each four colors). This configuration allows the inkjet recording process to be sped up. To achieve a resolution of 1200 dpi at a high speed, for example, the heads in the respective colors in the inkjet head 170 may be fixed in a manner offset from one another to correct the pitch between the nozzles ejecting ink. Furthermore, the heads of the respective colors may be input with a driving pulse with varying driving frequencies that correspond to the three different capacities of ink dots ejected from the nozzles, e.g., large/medium/small droplets, for example.

On the downstream of the inkjet head 170, a reversing mechanism 193 for reversing the treated object 20 is provided. For duplex printing, for example, the reversing mechanism 193 reverses the treated object 20 fed along the conveying path in the conveying direction D1, and sends the reversed treated object 20 to a conveying direction D2 that is a direction opposite to the conveying direction D1. The controlling unit not illustrated causes the conveying rollers 190 to rotate in a direction opposite to the direction used while the treated object 20 is conveyed in the conveying direction D1 (to rotate backwardly). The reversed treated object 20 is thus conveyed backwardly to the conveying path positioned on the upstream of the plasma treatment apparatus 100. The controlling unit, not illustrated, rotates the conveying rollers 190 forwardly, so that the reversed treated object 20 is passed through the plasma treatment apparatus 100 and the inkjet head 170 again. The plasma treatment and the image formation are then performed to the rear side of the treated object 20. The treated object 20 having both surfaces completed with the plasma treatment and the image formation may be discharged as it is just by being passed through the reversing mechanism 193, or may be discharged after being reversed again in the reversing mechanism 193.

Figure 14:
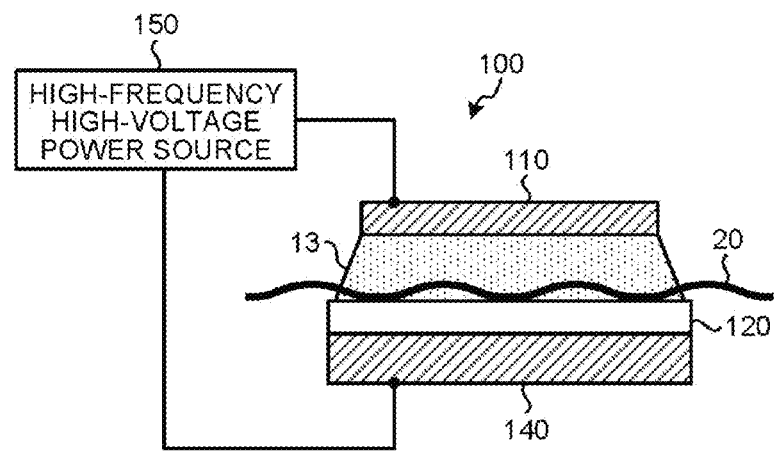
FIG. 14 is a schematic for explaining the effect of the plasma treatment according to the first embodiment in the simplex printing.

The effect of the plasma treatment applied to the treated object 20 will now be explained. The effect of the plasma treatment appears on both sides of the treated object 20, even if only one side is plasma-treated. FIG. 14 illustrates the mechanism how it takes place. As illustrated in FIG. 14, the treated surface of the treated object 20 is plasma-treated by being brought into contact with the atmospheric-pressure non-equilibrium plasma 13 generated between the electrodes. In the process of plasma treatment, the treated object 20 is conveyed between the electrodes, while the surface on the opposite side of the treated surface serving as a support is kept in contact with the dielectric 120 (that may be the counter electrode 140 or the discharge electrode 110). Therefore, in principle, the surface on the opposite side of the treated surface is not brought into contact with the atmospheric-pressure non-equilibrium plasma 13, and is not plasma-treated, but in reality, there is a gap between the surface on the opposite side of the treated surface and the dielectric 120, so that the atmospheric-pressure non-equilibrium plasma 13 is present in that space, too. As a result, the surface on the opposite side of the treated surface also is plasma-treated.

In the manner described above, even when only one side is plasma-treated, the effect of plasma treatment appears on both sides of the treated object 20. Therefore, if both sides of the treated object 20 are plasma-treated with the same amount of plasma energy as that used in a simplex treatment, both sides of the treated object 20 are plasma-treated with an amount of plasma energy larger than the intended dose.

Figure 15:
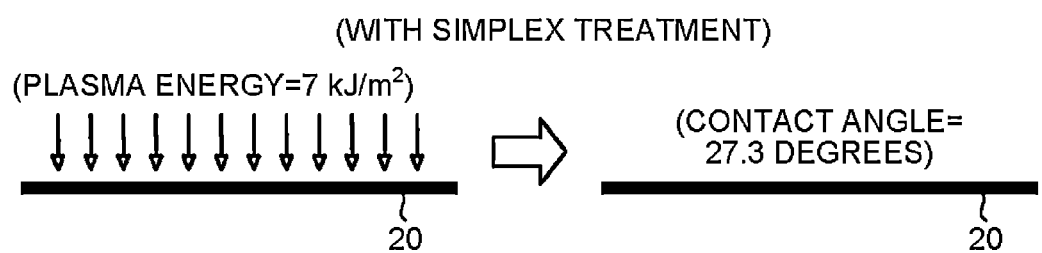
FIG. 15 is a schematic illustrating an example of the effect of a simplex plasma treatment according to the first embodiment represented as a contact angle.
Figure 16:
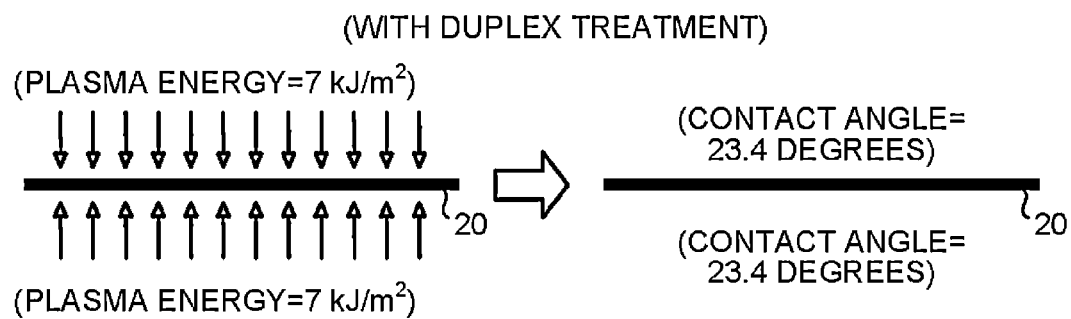
FIG. 16 is a schematic illustrating an effect of an example of a duplex plasma treatment according to the first embodiment represented as a contact angle.

FIG. 15 is a schematic illustrating an example of the effect of the simplex plasma treatment represented as a contact angle. FIG. 16 is a schematic illustrating an effect of an example of the duplex plasma treatment represented as a contact angle. As illustrated in FIGS. 15 and 16, when both sides of the treated object 20 are treated with plasma using the same amount of plasma energy (=7 kJ/m$^2$) as that used in the simplex treatment (=7 kJ/m$^2$), a smaller (=23.4 degrees) contact angle with respect to the treated object 20 is achieved, than that (=27.3 degrees) achieved in the simplex treatment. This result indicates that the effect of the plasma treatment achieved in the duplex treatment is larger than that in the simplex treatment. In the example illustrated FIGS. 15 and 16, offset coat paper is used as the treated object 20. The contact angle represents a contact angle with water.

Figures 17, 18:
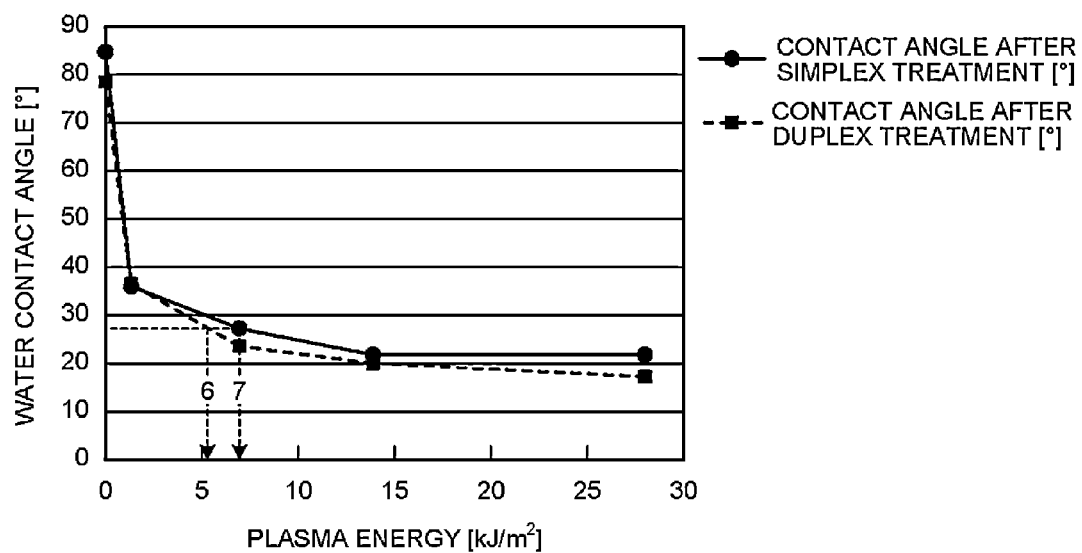
FIG. 17 is a table illustrating experiment data for comparing the effects of the simplex plasma treatment and the duplex plasma treatment according to the first embodiment.
FIG. 18 is a graph illustrating experiment data for comparing the effects of the simplex plasma treatment and the duplex plasma treatment according to the first embodiment.

FIGS. 17 and 18 are schematics of experiment data for comparing the effects of the simplex plasma treatment and the duplex plasma treatment. Illustrated in FIGS. 17 and 18 are examples in which offset coat paper is used as the treated object 20, and the contact angle represents a contact angle with water. As illustrated in FIGS. 17 and 18, the contact angle on the treated object 20 without the plasma treatment is 78 degrees to 85 degrees. This contact angle is reduced further as the amount of plasma energy is increased, in both of the simplex treatment and the duplex treatment. As explained with reference to FIGS. 15 and 16, however, if both sides of the treated object 20 are plasma-treated with the same amount of plasma energy (=7 kJ/m$^2$) as that used in the simplex treatment, the effect of the plasma treatment is increased, and, as a result, the contact angle is smaller (=23.4 degrees) than that (=27.3 degrees) achieved in the simplex treatment.

To achieve the same level of plasma treatment effect in the duplex treatment as that in the simplex treatment (e.g., contact angle of 27.3 degrees), FIGS. 17 and 18 indicate that an amount of plasma energy of 6 kJ/m$^2$ or so should be used for both of the front and the rear sides in the duplex treatment. This indicates that the duplex treatment can achieve the same effect as the simplex treatment with a smaller amount of plasma energy than that used in the simplex treatment.

Figure 19:
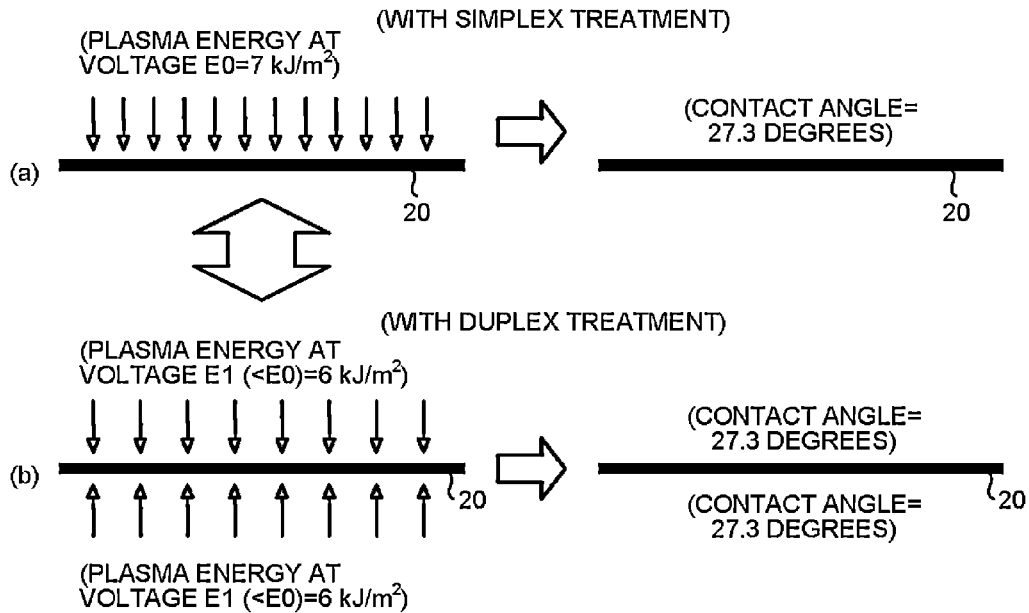
FIG. 19 is a schematic illustrating a way of changing the doses of plasma energy for the simplex treatment and for the duplex treatment by changing the pulse voltage in the first embodiment.

The doses of plasma energy may be changed for the simplex treatment and for the duplex treatment by switching the pulse voltage E applied to the discharge electrode 110 in the simplex treatment (a voltage E0 in a part (a) in FIG. 19), and that applied in the duplex treatment (a voltage E1 in a part (b) in FIG. 19), as illustrated in the parts (a) and (b) in FIG. 19. Because a smaller amount (e.g., density) of plasma is generated when a lower pulse voltage E is applied to the discharge electrode 110, a smaller amount of plasma energy is delivered to the treated object 20. As a result, a smaller amount of plasma energy can be delivered to one side in the duplex treatment, so that the effect of the plasma treatment equivalent to that achieved on the treated surface in the simplex plasma treatment can be achieved on both sides in the duplex treatment. In addition to the pulse voltage, the length of time and the frequency, for example, may also be changed, to switch the doses of plasma energy delivered to the treated object 20.

Figure 20:
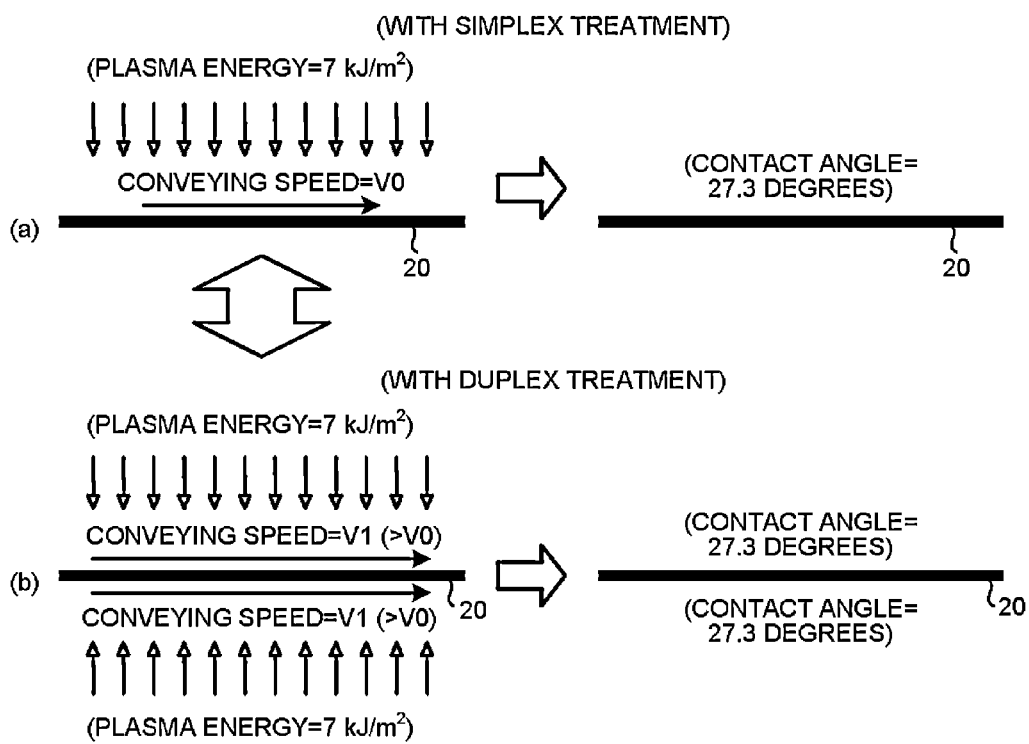
FIG. 20 is a schematic illustrating a way of changing the doses of plasma energy for the simplex treatment and for the duplex treatment by changing a conveying speed in the first embodiment.

Another possible way for switching the doses of plasma energy for the simplex treatment and the duplex treatment is to switch the conveying speeds V of the treated object 20 for the simplex treatment (a conveying speed V0 in a part (a) in FIG. 20) and for the duplex treatment (a conveying speed V1 in a part (b) in FIG. 20), as illustrated in the parts (a) and (b) in FIG. 20. When conveying speed V at which the treated object 20 is passed through the plasma treatment apparatus 100 is increased, the time for which the treated object 20 is plasma-treated is reduced, so that a smaller amount of plasma energy is delivered to the treated object 20. As a result, the effect of the plasma treatment equivalent to that achieved on the treated surface in the simplex plasma treatment can be achieved on both sides in the duplex treatment.

In the duplex treatment, the front and the rear sides do not necessarily need to be treated with the same amount of plasma energy, and the doses may be changed as appropriate depending on the difference in characteristics of the front and the rear sides of the treated object 20, on the ink used in the respective sides, the original images to be printed, the printing modes, and the like.

Figure 21:
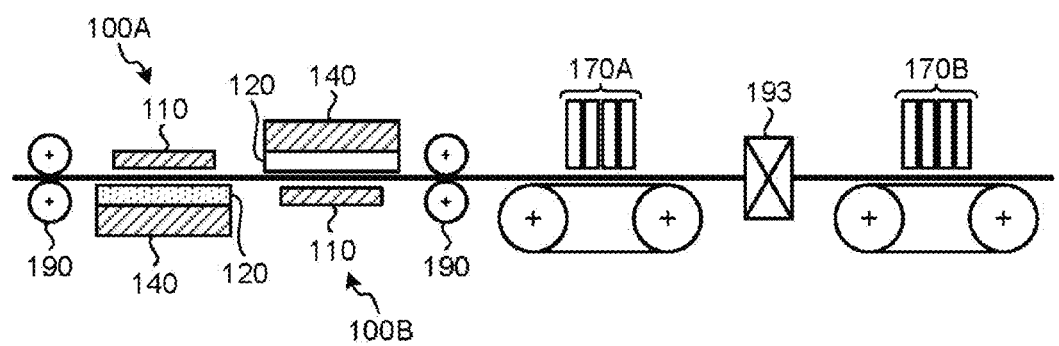
FIG. 21 is a schematic illustrating an exemplary general structure of a printing apparatus (system) capable of using roll paper as the treated object according to the first embodiment.

Furthermore, explained above is an example of cut paper that is reversible in the conveying path, but the present invention is not limited thereto. FIG. 21 is a schematic of an exemplary general structure of a printing apparatus (system) capable of using roll paper as the treated object 20. Illustrated in FIG. 21 are exemplary general structures around the plasma treatment apparatus and the inkjet head, in the same manner as in FIG. 13. Because the other structures are the same as those in the printing apparatus 1 illustrated in FIG. 12, detailed explanations thereof are omitted herein.

The printing apparatus (system) 1 illustrated in FIG. 21 includes two plasma treatment apparatuses 100A and 100B, and two inkjet heads 170A and 170B, and the reversing mechanism 193. These two plasma treatment apparatuses 100A and 100B have electrodes arranged facing opposite directions so that the plasma treatment apparatus 100A plasma-treats one side (referred to as a front side) of the treated object 20, and the plasma treatment apparatus 100B plasma-treats other side (referred to as a rear side) of the treated object 20, for example. The general structure of each of the plasma treatment apparatuses 100A and 100B may be the same as that of the plasma treatment apparatus 100 illustrated in FIG. 13. These two plasma treatment apparatuses 100A and 100B are positioned on the upstream side of the two inkjet heads 170A and 170B.

Between the two inkjet heads 170A and 170B, the reversing mechanism 193 for reversing the side of the treated object 20 is provided. The treated object 20 having one side (e.g., front side) formed with an image by the inkjet head 170A is reversed by the reversing mechanism 193, and guided to the inkjet head 170B. The inkjet head 170B forms an image on other side (e.g., rear side) of the reversed treated object 20. In this manner, a printout having its front and rear sides plasma-treated and having images formed can be achieved.

Figure 22:
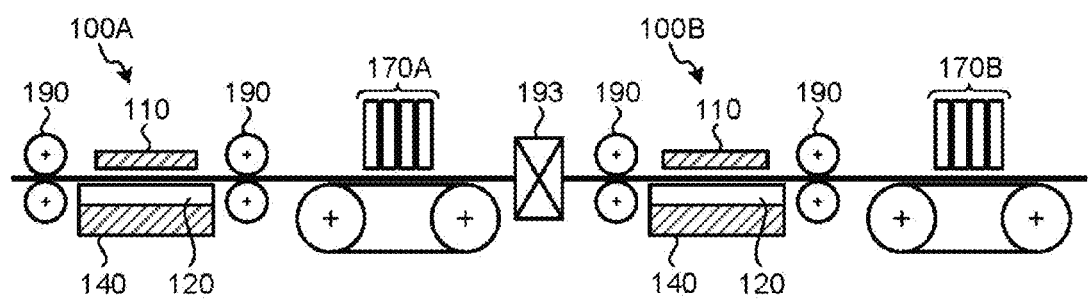
FIG. 22 is a schematic illustrating another exemplary general structure of the printing apparatus (system) capable of using roll paper as the treated object according to the first embodiment.

Furthermore, the printing apparatus (system) 1 including the two plasma treatment apparatuses 100A and 100B, the two inkjet heads 170A and 170B, and the reversing mechanism 193 may be configured in a manner illustrated in FIG. 22. In other words, the inkjet head 170A may be positioned immediately subsequent to the plasma treatment apparatus 100A, and the inkjet head 170B may be positioned immediately subsequent to the plasma treatment apparatus 100B. The reversing mechanism 193 may then be positioned between these pairs. In such a configuration, the electrodes of the plasma treatment apparatus 100B that is positioned on the downstream side of the reversing mechanism 193 and plasma-treats the rear side of the treated object 20 may be arranged facing the same direction as those in the plasma treatment apparatus 100A. Furthermore, the reversing mechanism 193 positioned between the inkjet head 170A and the plasma treatment apparatus 100B may be provided with a drying mechanism for drying the treated object 20 having humidity increased by the image formation by the inkjet head 170A. The reversing mechanism 193 may not be provided with the drying mechanism if sufficient dryness of the treated object 20 to be conveyed into the plasma treatment apparatus 100B can be ensured.

When the simplex treatment is performed in the structure illustrated in FIGS. 21 and 22, driving of the plasma treatment apparatus 100B and the inkjet head 170B, or the plasma treatment apparatus 100A and the inkjet head 170A may be turned OFF. In such a case, the reversing mechanism 193 does not need to reverse the treated object 20.

Furthermore, explained above as an exemplary configuration of a discharger unit in the plasma treatment apparatus 100 is a configuration in which the flat-plate shaped dielectric 120 is interposed between the flat-plate shaped discharge electrode 110 and the flat-plate shaped counter electrode 140, but the discharger unit is not limited to such a configuration. Other exemplary configurations of the discharger unit according to the first embodiment will now be explained in detail with reference to some of the drawings.

Figure 23:
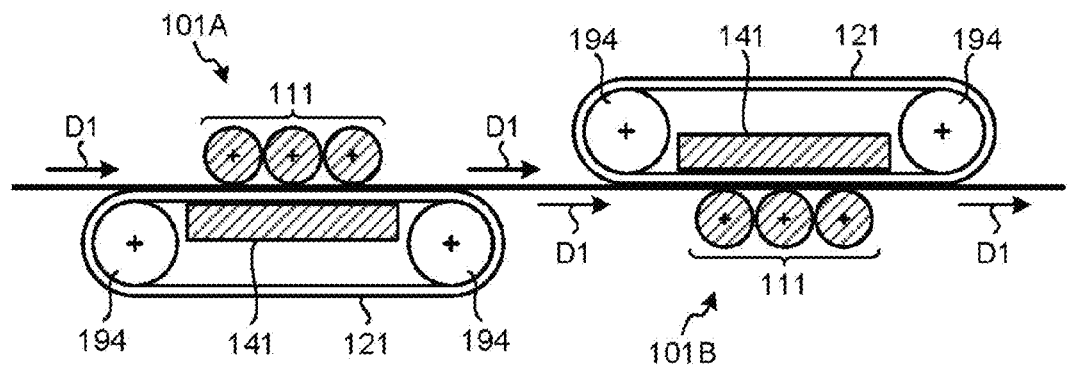
FIG. 23 is a schematic illustrating an exemplary configuration of a discharger unit according to a first modification of the first embodiment.

FIG. 23 is a schematic illustrating an exemplary configuration of a discharger unit according to a first modification. The flat-plate shaped discharge electrode 110 in the plasma treatment apparatus 100 (plasma treatment apparatuses 100A and 100B in FIG. 21 or 22) may be replaced with a plurality of roller-like discharge electrodes 111, as in plasma treatment apparatuses 101A and 101B illustrated as an example in FIG. 23. These discharge electrodes 111, all of which serve as one unit, correspond to the discharge electrode 11 (first electrode/third electrode) in FIG. 1. The roller-like discharge electrodes 111 are, for example, cylindrical or columnar electrodes, and are positioned in a manner separated from one another at a distance not contacting one another. Each of the discharge electrodes 111 may be supported rotatably, and may be configured to be brought into contact with the treated object 20 passing through the plasma treatment apparatus 101A or 101B. In such a case, the dielectric 120 in the plasma treatment apparatus 100 (the plasma treatment apparatuses 100A and 100B in FIG. 21 or 22) is preferably replaced with a dielectric 121 that is configured as an endless belt stretched across rotating rollers 194 that are driven in rotation by a controlling unit not illustrated. As a material of the endless-belt type dielectric 121, an insulator such as polyimide and silicone may be used. In this configuration, the treated object 20 is plasma-treated while being passed between the roller-like discharge electrodes 111 and a counter electrode 141, while being carried on the endless belt dielectric 121 serving as a conveying mechanism as well.

Figure 24:
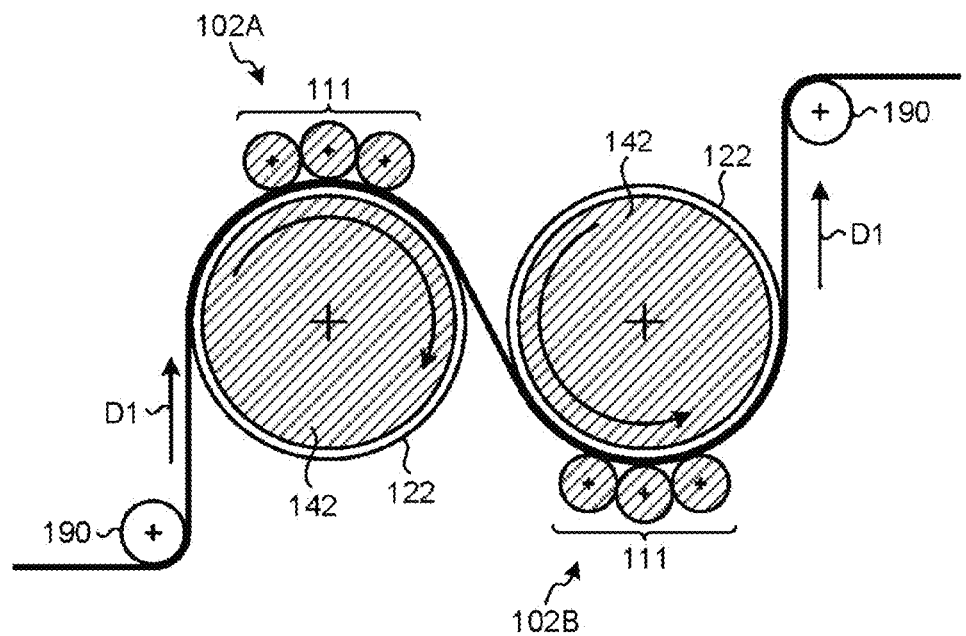
FIG. 24 is a schematic illustrating an exemplary configuration of a discharger unit according to a second modification of the first embodiment.

FIG. 24 is a schematic of a general configuration illustrating a second modification representing a further modification of the discharger unit according to the first modification. The counter electrode 141 and the dielectric 121 in the plasma treatment apparatuses 101A and 101B may be replaced with a cylindrical or columnar counter electrode 142, and with a dielectric 122 covering at least a part of a side (curved surface) of the counter electrode 142, respectively, as in plasma treatment apparatus 102A and 102B illustrated in FIG. 24 as an example. In this configuration, the counter electrode 142 also serves as a conveying mechanism for conveying the treated object 20, by being driven in rotation under the control of a controlling unit not illustrated. As a material of the dielectric 122 covering at least a part of the counter electrode 142, an insulator such as silicone or ceramic may be used.

Figure 25:
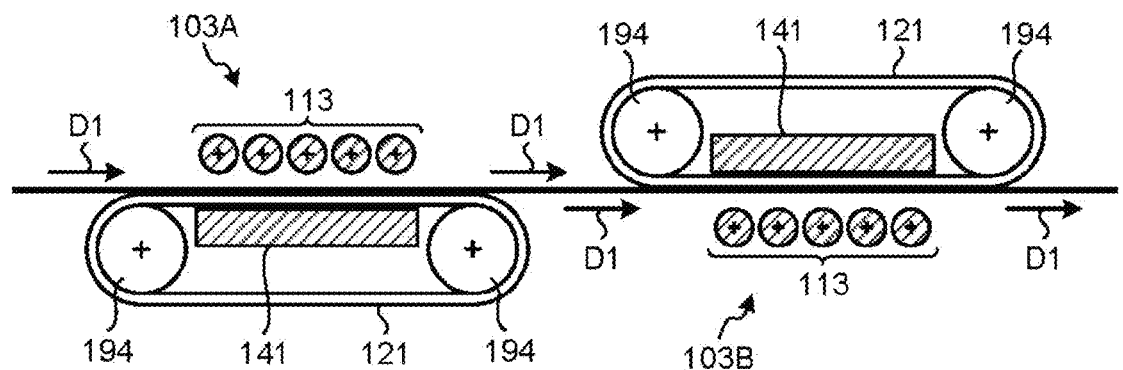
FIG. 25 is a schematic illustrating an exemplary configuration of a discharger unit according to a third modification of the first embodiment.

FIG. 25 is a schematic illustrating an exemplary configuration of a discharger unit according to a third modification. The flat-plate shaped discharge electrode 110 may be replaced with a plurality of wire discharge electrodes 113, as in plasma treatment apparatuses 103A and 103B illustrated in FIG. 25 as an example. These discharge electrodes 113, all of which serve as one unit in the same manner as the discharge electrodes 111, correspond to the discharge electrode 11 (first electrode/third electrode) illustrated in FIG. 1. The cross-sectional diameter of each of the wire discharge electrodes 113 may be one millimeter to three millimeters or so. The discharge electrodes 113 may be positioned in a manner separated from the treated object 20. Such a configuration can also achieve the same effects by performing an operation that is similar to that according to the first modification illustrated in FIG. 23.

Figure 26:
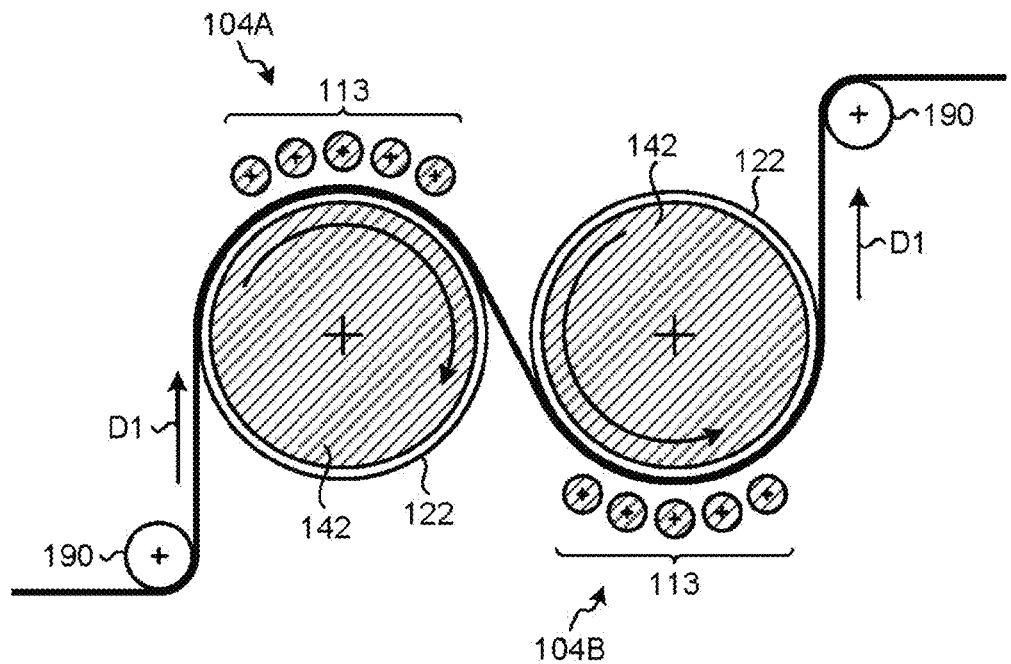
FIG. 26 is a schematic illustrating an exemplary configuration of a discharger unit according to a fourth modification of the first embodiment.

FIG. 26 is a schematic of a general configuration illustrating a fourth modification representing a further modification of the discharger unit according to the third modification. The counter electrode 141 and the dielectric 121 may be replaced with the cylindrical or columnar counter electrode 142 according to the third modification illustrated in FIG. 25, and with the dielectric 122 covering at least a part of the side (curved surface) of the counter electrode 142, respectively, in the same manner as in the second modification. A configuration using such plasma treatment apparatuses 104A and 104B illustrated in FIG. 26 can also achieve the same effects by performing an operation that is similar to that according to the second modification illustrated in FIG. 24.

Figure 27:
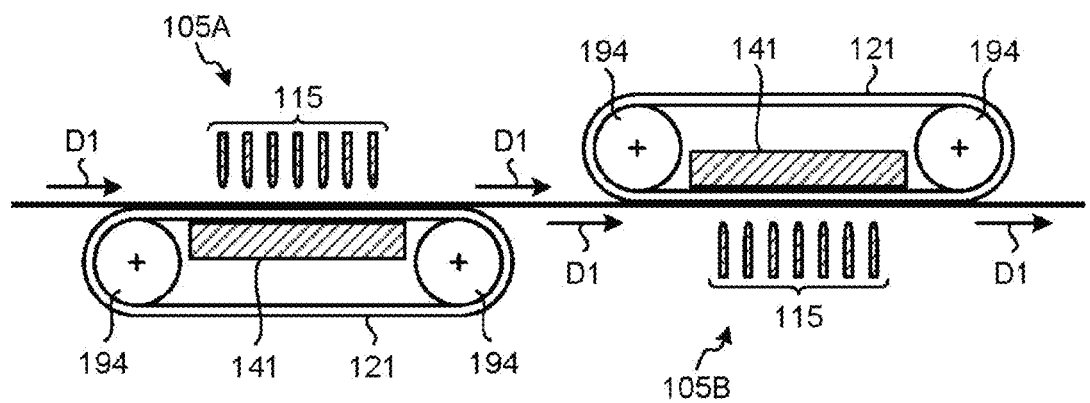
FIG. 27 is a schematic illustrating an exemplary configuration of a discharger unit according to a fifth modification of the first embodiment.

FIG. 27 is a schematic illustrating an exemplary configuration of a discharger unit according to a fifth modification. The flat-plate shaped discharge electrode 110 may be replaced with a plurality of blade-like discharge electrodes 115, as in plasma treatment apparatuses 105A and 105B illustrated in FIG. 27 as an example. These discharge electrodes 115, all of which serve as one unit in the same manner as the discharge electrodes 111, correspond to the discharge electrode 11 (first electrode/third electrode) illustrated in FIG. 1. The thickness of the tip of each of the blade-like discharge electrodes 115 may be 0.5 millimeters to 2.0 millimeters or so. The discharge electrodes 115 may be positioned in a manner separated from the treated object 20. Such a configuration can also achieve the same effects by performing an operation that is similar to that according to the first modification illustrated in FIG. 23.

Figure 28:
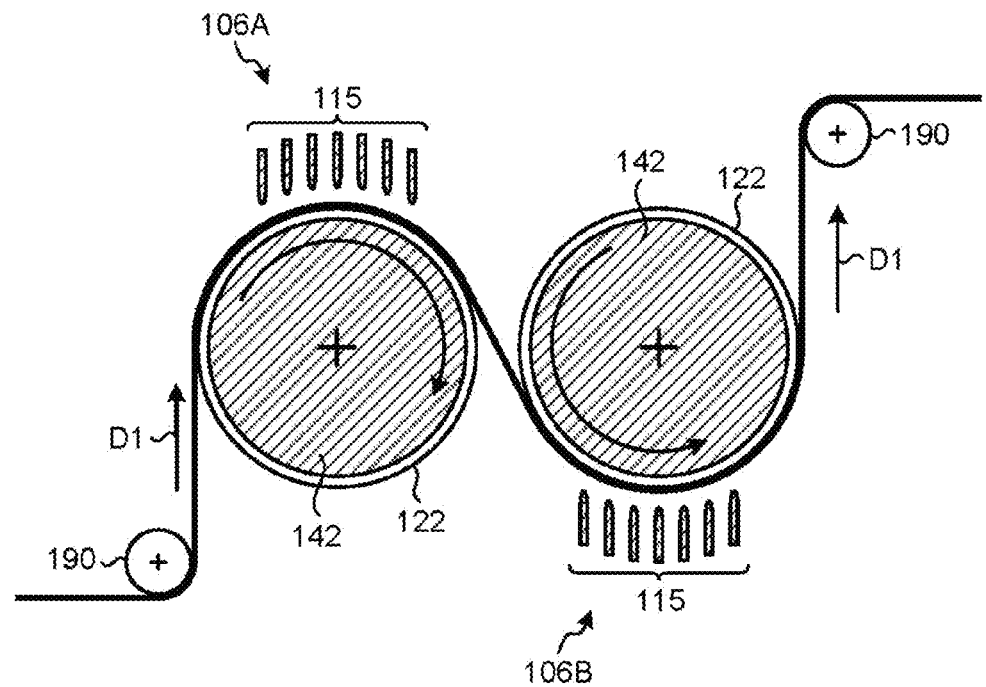
FIG. 28 is a schematic illustrating an exemplary configuration of a discharger unit according to a sixth modification of the first embodiment.

FIG. 28 is a schematic of a general configuration illustrating a sixth modification representing a further modification of the discharger unit according to the fifth modification. The counter electrode 141 and the dielectric 121 according to the fifth modification illustrated in FIG. 27 may be replaced with the cylindrical or columnar counter electrode 142 and the dielectric 122 covering at least a part of the side (curved surface) of the counter electrode 142, respectively, in the same manner as in the second modification. A configuration using such plasma treatment apparatuses 106A and 106B illustrated in FIG. 28 can achieve the same effects by performing an operation that is similar to that according to the second modification illustrated in FIG. 24.

In the configurations illustrated in FIGS. 23 to 28, by increasing the number of discharge electrodes, the treatment effect given to the treated object 20 in one plasma treatment can be increased. Furthermore, by increasing the number of discharge electrodes, unevenness in the plasma treatment can also be reduced, advantageously.

Furthermore, other possible ways for switching the doses of plasma energy for the simplex treatment and the duplex treatment include those described below, in addition to changing the pulse voltage or the conveying speed described above.

Figure 29:
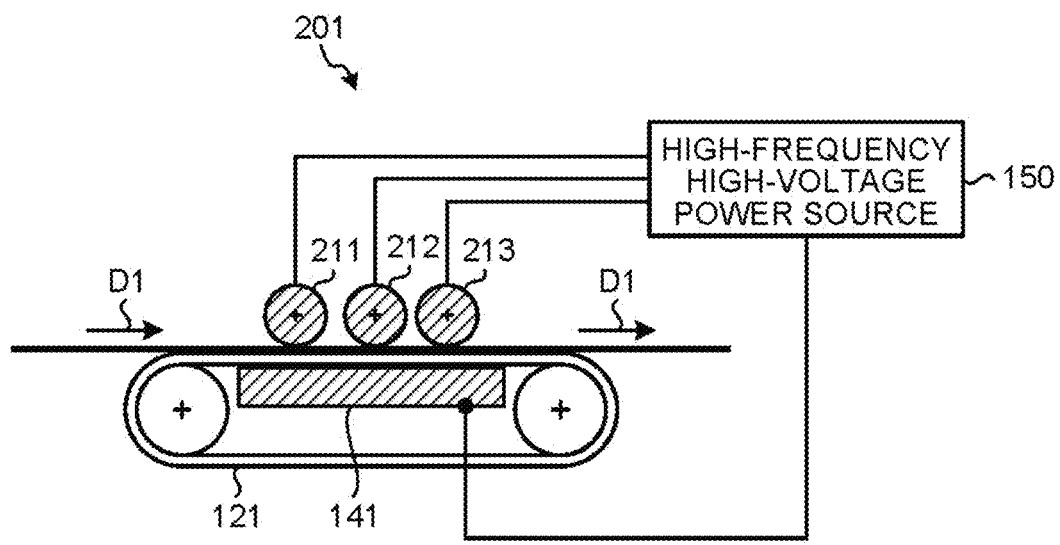
FIG. 29 is a schematic of a structure for changing the amount of plasma energy by changing the number of driven discharge electrodes according to the first embodiment.

FIG. 29 is a schematic of a structure for changing the amount of plasma energy by changing the number of driven discharge electrodes. When a plasma treatment apparatus 201 is provided with a plurality of discharge electrodes 211 to 213 (first electrode to third electrode), as illustrated in FIG. 29, by switching the number of discharge electrodes receiving the supply of pulse voltage from the high-frequency high-voltage power source 150, the amount of plasma energy delivered to the treated object 20 can be changed. For example, in the example illustrated in FIG. 29, by reducing the number of driven discharge electrodes 211 to 213 from three to two, the amount of plasma energy delivered to the treated object 20 can be reduced. With this structure, the effect of the plasma treatment equivalent to that achieved on the treated surface in the simplex plasma treatment can be achieved on both sides in the duplex treatment. In a configuration in which two plasma treatment apparatuses 201 are installed along the conveying path, for example, the plasma treatment apparatus 201 that remains unused in the simplex treatment but is used in the duplex treatment may be provided with discharge electrodes the number of which is smaller than the number of those provided to the plasma treatment apparatus 201 used in both of the simplex treatment and the duplex treatment.

Figure 30:
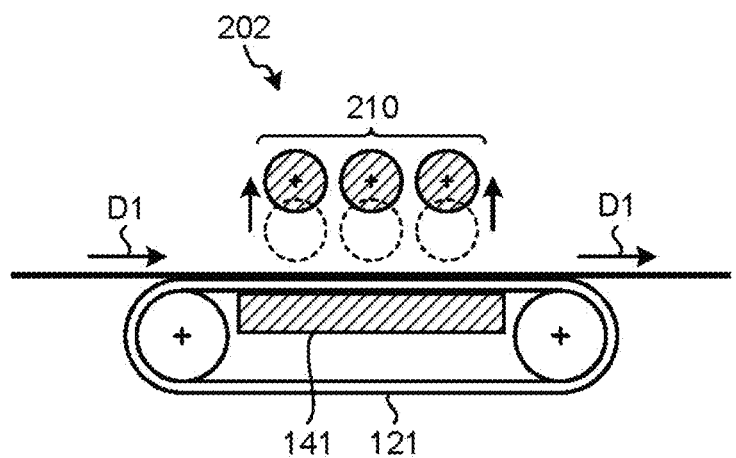
FIG. 30 is a schematic of a structure for changing the amount of plasma energy by changing the distance between the discharge electrodes and the counter electrode according to the first embodiment.

FIG. 30 is a schematic of a structure for changing the amount of plasma energy by changing the distance between the discharge electrodes and the counter electrode. As illustrated in FIG. 30, this plasma treatment apparatus 202 includes, for example, a moving mechanism for moving the discharge electrodes 210 closer to or further away from the counter electrode 141. The amount of plasma energy delivered to the treated object 20 can be reduced by increasing the distance between the discharge electrodes 210 and the counter electrode 141. With this structure, the effect of the plasma treatment equivalent to that achieved on the treated surface in the simplex plasma treatment can be achieved on both sides in the duplex treatment.

As explained above, according to the first embodiment, the amount of plasma energy delivered to each of the front and the rear sides can be adjusted, so that high-quality images at the same level can be achieved on both sides of the treated object 20.

Second Embodiment

A treated object modifying apparatus, a printing apparatus, a printing system, and a method for manufacturing a printout according to a second embodiment of the present invention will now be explained in detail with reference to some of the drawings.

In the first embodiment, when the front and the rear sides of the treated object 20 are processed using a plurality of plasma treatment apparatuses 100A and 100B and a plurality of inkjet heads 170A and 170B, for example, as illustrated in FIG. 21, the humidity of the treated object 20 on which an image is formed by the inkjet head 170B positioned on the downstream side may have been increased by the image formation by the inkjet head 170A positioned on the upstream side. In such a case, as illustrated in FIG. 31, a drying mechanism 185 for drying the treated object 20 having humidity increased by the image formation by the upstream inkjet head 170A may be provided between the inkjet head 170A and the inkjet head 170B.

When the drying by the drying mechanism 185 causes an increase in the temperature of the treated object 20, the heat may deteriorate the effect of the plasma treatment. To address this issue, in the example illustrated in FIG. 31, when the treated object 20 is dried between the image formations on one side (e.g., the front side on which the inkjet head 170A forms an image) and on the other side (e.g., the rear side on which the inkjet head 170B forms an image) of the treated object 20, the amount of plasma energy delivered to the side on which an image is formed later in time (in this example, the rear side on which the inkjet head 170B forms an image) is set larger than that delivered to the side on which an image is formed earlier in time (in this example, the side on which the inkjet head 170A forms an image). The amount by which the amount of plasma energy is made larger may be determined based on a result of determining in advance how much the effect of the plasma treatment is reduced by drying. With such a configuration, the front and the rear sides of the treated object 20 can be treated with substantially the same amount of plasma energy, and thus equivalently high-quality images can be achieved on the front side and the rear side of the treated object 20.

Furthermore, in the first embodiment, for example, as illustrated in FIG. 22, when the plasma treatment apparatus 100A and the inkjet head 170A positioned on the upstream side perform the plasma treatment and the image formation, respectively, on one side of the treated object 20 (e.g., front side) and then the plasma treatment apparatus 100B and the inkjet head 170B on the downstream side perform the plasma treatment and the image formation, respectively, on the other side (e.g., rear side) of the treated object 20, the humidity of the treated object 20 to be plasma-treated in the plasma treatment apparatus 100B on the downstream side may be increased by the image formation by the inkjet head 170A, as a result of the image formation by the inkjet head 170A on the upstream side. When the treated object 20 is humid, the effect of the plasma treatment may be increased unintentionally, and controlling of the effect of the plasma treatment becomes difficult. While it is possible to provide the drying mechanism 185 between the inkjet head 170A on the upstream side and the plasma treatment apparatus 100B on the downstream side, as illustrated in FIG. 32, to address this issue, the heat in the drying process may reduce the effect of the plasma treatment, as mentioned earlier. In the example illustrated in FIG. 32, therefore, the amount of plasma energy delivered to the side on which an image is formed later in time (in this example, the rear side on which the inkjet head 170B forms an image formation) is set larger than the amount of plasma energy to be delivered to the side on which an image is formed earlier in time (in this example, the side on which the inkjet head 170A forms an image), in the same manner as illustrated in FIG. 31. The amount by which the amount of plasma energy is made larger may be determined based on a result of determining in advance how much the effect of the plasma treatment is reduced by drying. With such a configuration, because the front and the rear sides of the treated object 20 can be treated with substantially the same amount of plasma energy, equivalently high-quality images can be achieved on the front side and the rear side of the treated object, in the same manner as in the example illustrated in FIG. 31.

Figure 31:
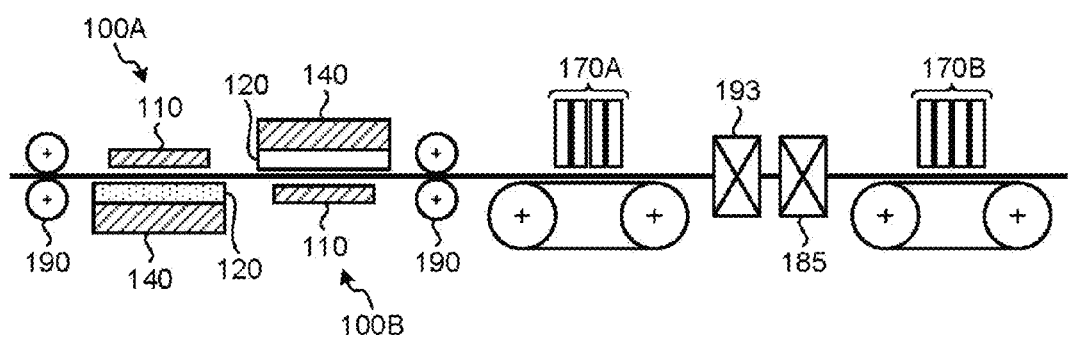
FIG. 31 is a schematic of an exemplary general structure of a printing apparatus (system) according to a second embodiment of the present invention.
Figure 32:
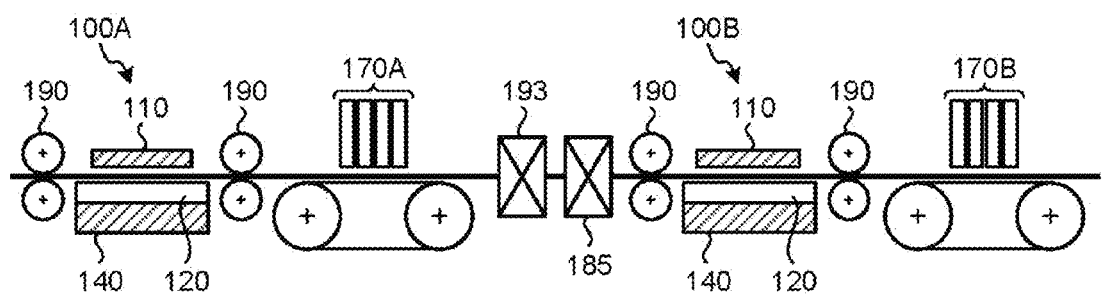
FIG. 32 is a schematic of another exemplary general structure of the printing apparatus (system) according to the second embodiment.

Illustrated in FIGS. 31 and 32 are examples in which duplex plasma treatment is applied to the front and the rear sides of the treated object 20, but the present invention is not limited thereto. For example, if the degree by which the effect of the plasma treatment is reduced by drying is approximately at the same level as the difference in the effects of plasma treatment on the front and the rear sides of the treated object 20 when only one side of the treated object 20 is plasma-treated, the second plasma treatment may be omitted. In such a case, an image is at first formed on the side of the treated object 20 in which the effect of the plasma treatment is lower, the treated object 20 is then dried, and finally an image is formed on the other side.

As described above, according to the second embodiment, even in the duplex treatment including a drying process, the amount of plasma energy in the front and the rear sides of the treated object 20 can be brought to substantially the same level when an image is to be formed. Therefore, equivalently high-quality images can be achieved on the front side and the rear side of the treated object 20. Because the other structures, operations, and the effects are the same as those in the first embodiment, detailed explanations thereof are omitted herein.

According to the present invention, it is possible to provide a treated object modifying apparatus, a printing apparatus, a printing system, and a method for manufacturing a printout capable of modifying a treated object in such a manner that a high-quality printout can be produced.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A treated object modifying apparatus comprising:
   a plasma-treating unit that comprises a first electrode unit, a second electrode unit, and a dielectric that is interposed between the first electrode unit and the second electrode unit, and that plasma-treats a treated object positioned between the first electrode unit and the dielectric by applying a voltage to one of the first electrode unit and the second electrode unit; and
   a controlling unit that controls the plasma-treating unit so that an amount of plasma energy delivered to any one of sides of the treated object in a duplex treatment is different from an amount of plasma energy delivered to any one of the sides of the treated object in a simplex treatment, wherein the duplex treatment is a plasma treatment performed with one side of the treated object facing the first electrode unit, and another plasma treatment performed with the other side of the treated object facing the first electrode unit, and the simplex treatment is a plasma treatment performed with one side of the treated object facing the first electrode unit.

2. The treated object modifying apparatus according to claim 1, wherein the controlling unit controls the plasma-treating unit in such a manner that an amount of plasma energy delivered to the one or the other side in the duplex treatment is smaller than an amount of plasma energy delivered to any one of the sides in the simplex treatment.

3. The treated object modifying apparatus according to claim 1, wherein the plasma-treating unit acidifies at least a front side of the treated object.

4. The treated object modifying apparatus according to claim 1, further comprising a power source that applies a voltage to the first electrode unit or the second electrode unit, wherein
the controlling unit controls the amount of plasma energy by controlling the voltage applied by the power source.

5. The treated object modifying apparatus according to claim 1, wherein
the first electrode unit or the second electrode unit includes a plurality of electrodes, and
the controlling unit controls the amount of plasma energy by controlling a power source applying a voltage to the electrodes.

6. The treated object modifying apparatus according to claim 1, further comprising a conveying unit that conveys the treated object, wherein
the controlling unit controls the amount of plasma energy by controlling a conveying speed of the treated object conveyed by the conveying unit.

7. The treated object modifying apparatus according to claim 1, further comprising a moving mechanism that changes a distance between the first electrode unit and the second electrode unit, wherein
the controlling unit controls the amount of plasma energy by controlling the distance using the moving mechanism.

8. A printing apparatus comprising:
the treated object modifying apparatus according to claim 1; and
an inkjet recording unit that forms an image by ejecting ink to the treated object, wherein
the inkjet recording unit forms an image by ejecting ink to the treated object applied with the plasma treatment.

9. A printing system comprising:
the treated object modifying apparatus according to claim 1; and
an inkjet recording apparatus that forms an image by ejecting ink to the treated object, wherein
the inkjet recording apparatus forms an image by ejecting ink to the treated object applied with the plasma treatment.

10. A treated object modifying apparatus comprising:
a first plasma-treating unit that comprises a first electrode unit, a second electrode unit, and a dielectric that is interposed between the first electrode unit and the second electrode unit, and that plasma-treats a treated object positioned between the first electrode unit and the dielectric by applying a voltage to one of the first electrode unit and the second electrode unit;
a second plasma-treating unit that comprises a third electrode unit, a fourth electrode unit, and a dielectric that is interposed between the third electrode unit and the fourth electrode unit, and that plasma-treats the treated object positioned between the third electrode unit and the dielectric by applying a voltage to one of the third electrode unit and the fourth electrode unit; and
a controlling unit that controls the plasma-treating units so that an amount of plasma energy delivered to any one of sides of the treated object in a duplex treatment is different from an amount of plasma energy delivered to any one of the sides of the treated object in a simplex treatment, wherein the duplex treatment is a plasma treatment performed with one side of the treated object facing the first electrode unit, and another plasma treatment performed with the other side of the treated object facing the third electrode unit, and the simplex treatment is a plasma treatment performed with one side of the treated object facing the first or the third electrode unit.

11. The treated object modifying apparatus according to claim 10, wherein the controlling unit controls the plasma-treating unit in such a manner that an amount of plasma energy delivered to the one or the other side in the duplex treatment is smaller than an amount of plasma energy delivered to any one of the sides in the simplex treatment.

12. The treated object modifying apparatus according to claim 10, wherein the plasma-treating unit acidifies at least a front side of the treated object.

13. The treated object modifying apparatus according to claim 10, further comprising:
a first power source that applies a voltage to the first electrode unit or the second electrode unit; and
a second power source that applies a voltage to the third electrode unit or the fourth electrode unit, wherein
the controlling unit controls the amount of plasma energy by controlling at least one of the first power source and the second power source.

14. The treated object modifying apparatus according to claim 10, wherein
the first electrode unit or the second electrode unit is configured as a first electrode group including a plurality of electrodes,
the third electrode unit or the fourth electrode unit is configured as a second electrode group including a plurality of electrodes, and
the controlling unit controls the amount of plasma energy by controlling a power source applying a voltage to at least one of the first electrode group and the second electrode group.

15. The treated object modifying apparatus according to claim 10, further comprising a conveying unit that conveys the treated object, wherein
the controlling unit controls the amount of plasma energy by controlling a conveying speed of the treated object conveyed by the conveying unit.

16. The treated object modifying apparatus according to claim 10, further comprising:
a first moving mechanism that changes a distance between the first electrode unit and the second electrode unit; and
a second moving mechanism that changes a distance between the third electrode unit and the fourth electrode unit, wherein the controlling unit controls the amount of plasma energy by controlling at least one of the first moving mechanism and the second moving mechanism.

17. A printing apparatus comprising:
the treated object modifying apparatus according to claim 10; and
an inkjet recording unit that forms an image by ejecting ink to the treated object, wherein
the inkjet recording unit forms an image by ejecting ink to the treated object applied with the plasma treatment.

18. A printing system comprising:
the treated object modifying apparatus according to claim 10; and
an inkjet recording apparatus that forms an image by ejecting ink to the treated object, wherein
the inkjet recording apparatus forms an image by ejecting ink to the treated object applied with the plasma treatment.

* * * * *